(12) United States Patent
Muramatsu et al.

(10) Patent No.: US 7,341,827 B2
(45) Date of Patent: Mar. 11, 2008

(54) SEPARATION-MATERIAL COMPOSITION FOR PHOTO-RESIST AND MANUFACTURING METHOD OF SEMICONDUCTOR DEVICE

(75) Inventors: Masafumi Muramatsu, Kanagawa (JP); Hayato Iwamoto, Kanagawa (JP); Kazumi Asada, Kanagawa (JP); Tomoko Suzuki, Tokyo (JP); Toshitaka Hiraga, Kanagawa (JP); Tetsuo Aoyama, Kanagawa (JP)

(73) Assignees: Sony Corporation (JP); EKC Technology K.K. (JP)

( * ) Notice: Subject to any disclaimer, the term of this patent is extended or adjusted under 35 U.S.C. 154(b) by 0 days.

(21) Appl. No.: 10/640,389

(22) Filed: Aug. 14, 2003

(65) Prior Publication Data

US 2004/0038154 A1    Feb. 26, 2004

(30) Foreign Application Priority Data

Aug. 14, 2002    (JP) ............................ P2002-236559
Jun. 4, 2003     (JP) ............................ P2003-159192

(51) Int. Cl.
*G03F 7/26* (2006.01)
(52) U.S. Cl. ..................................... 430/331
(58) Field of Classification Search ................. 430/331
See application file for complete search history.

(56) References Cited

U.S. PATENT DOCUMENTS 6,194,365 B1 * 2/2001 Lee ............................. 510/175

2003/0130148 A1 * 7/2003 Lee et al. ..................... 510/175
2005/0014667 A1 * 1/2005 Aoyama et al. ............. 510/175

FOREIGN PATENT DOCUMENTS

JP    2000-258924    9/2000
JP    2001-345303    12/2001

* cited by examiner

*Primary Examiner*—Kathleen Duda
(74) *Attorney, Agent, or Firm*—Rader Fishman & Grauer PLLC; Ronald P. Kananen

(57) ABSTRACT

One example of a separation-material composition for a photo-resist according to the present invention comprises 5.0 weight % of sulfamic acid, 34.7 weight % of $H_2O$, 0.3 weight % of ammonium 1-hydrogen difluoride, 30 weight % of N,N-dimethylacetamide and 30 weight % of diethylene glycol mono-n-buthyl ether. Another example of a separation-material composition for a photo-resist according to the present invention comprises 1-hydroxyethylidene-1, 3.0 weight % of 1-diphosphonic acid, 0.12 weight % of anmonium fluoride, 48.38 weight % of $H_2O$ and 48.5 weight % of diethylene glycol mono-n-buthl ether. The separation-material composition for the photo-resist is mainly used for a medicinal liquid washing liquid/scientific liquid in order to remove the photo-resist residuals and the by-product polymer after an ashing process of a photo-resist mask. It can propose a separation-material composition for a photo-resist such that the photo-resist residuals and the by-product polymer are easily removed after a dry etching process and at the same time the low dielectric-constant insulation film is avoided from erosion and oxidization.

2 Claims, 19 Drawing Sheets

Prior Art

SEPARATION-MATERIAL COMPOSITION FOR PHOTO-RESIST AND MANUFACTURING METHOD OF SEMICONDUCTOR DEVICE

BACKGROUND OF THE INVENTION

1. Field of the Invention

The present invention relates to a separation-material composition for a photo-resist and a manufacturing method of a semiconductor device, and more particularly to a separation-material composition for a photo-resist which is used for separating and removing a remaining photo-resist film, photo-resist residuals and residuals of the by-product polymer after an insulation film is processed with a dry-etching when, for example, a metal wiring is formed on a semiconductor substrate and further to a manufacturing method of a semiconductor device using the separation-material composition for the photo-resist.

The present invention relates especially to a separation-material composition for a photo-resist used when forming a wiring structure of a semiconductor device consisting of a copper wiring and a low dielectric-constant interlayer insulation film, and additionally to a manufacturing method of a semiconductor device using such a separation-material composition for a photo-resist.

2. Description of the Related Art

In recent years, a wiring-working dimension has become minutely smaller and smaller owing to a higher integration of a semiconductor device and at the same time the trend of a multi-layer constitution of the wiring has been progressed. Additionally, there has been a demand for a lower power supply, a high speed operation and the like together with a higher integration.

The increase of a wiring resistance and a wiring capacitance caused by a thinner wiring and a smaller pitch of the wiring leads to a deterioration of the operation speed and an increase of a power consumption. Accordingly, in order to satisfy the demand for a higher integration, for a lower power supply and for a higher operation speed it is necessary and inevitable to use copper which has a low electric resistance as a wiring material and to use a multi-layer wiring where a low dielectric-constant film is made as an interlayer insulation film.

Accordingly, as a material for an insulation film between wirings or for an interlayer insulation film, a silicon oxide film including fluorine, a silicon oxide film including carbon, hydrogen silsequioxane, methyl silsequioxane, polyacryl ether, Teflon (registered trademark) and the like have been investigated instead of a silicon oxide film which is film-made by a chemical vapor deposition (CVD) method or a spin-on coating method widely used at the present time. Hereinafter, insulation films formed by these low dielectric-constant materials are named or designated as low dielectric-constant insulation films (low-k films).

Further, for a wiring material, a Cu wiring which includes copper of a low electric resistance as a main component is investigated to be used instead of an Al wiring which includes aluminum as a main component and which is widely used at the present time. A Cu wiring is difficult to be etching processed as compared with an Al wiring, so that it is worked by a technique of a so-called damascene method.

A damascene method is roughly classified into a single damascene process and a dual damascene process.

A single damascene process is a process which is mainly applied when a wiring of a single layer is formed where a wiring groove of a predetermined pattern is preliminary made on an insulation film and the wiring groove is buried by piling metal layers on the insulation film such that a conductor layer is formed. Subsequently, the metal layers are polished by a certain polishing method such as a CMP method known in the art such that the insulation film will be exposed and at the same time the surface of the insulation film is made flat, and consequently a buried wiring is formed according to this technique.

As shown in FIG. 11A, for example, an insulation film 94 is film-made on a semiconductor substrate 92 on which a device such as a transistor is formed and subsequently an etching-stopper layer 96, a low dielectric-constant insulation film 98 and a cap insulation film 100 are successively film-made. Next, the cap insulation film 100 and the low dielectric-constant insulation film 98 are photolithography processed and etching processed to form a wiring groove 102. Subsequently, a barrier metal film 104/a Cu plated thin film 106 are piled on the cap insulation film 100, and further a Cu layer is piled. Next, the Cu layer and the barrier metal film 104/the Cu plated thin film 106 are polished by a CMP method and the like, so that a Cu-buried wiring 108 is formed in the wiring groove 102.

A dual damascene process is applied when a multi-layer wiring structure composing of a lower layer wiring and an upper layer wiring is formed. A contact hole connecting to the lower layer wiring and a wiring groove connected thereto are dry-etched to form an insulation film layer and the contact hole and the wiring groove are subsequently buried by a metal layer. After the metal film is polished, an electric contact plug which will be connected to a lower layer wiring having a buried contact hole and an upper layer wiring having a buried wiring groove are formed at the same time.

As shown in FIG. 11B, for example, an etching-stopper layer 110, a low dielectric-constant insulation film 112, an etching-stopper layer 114, a low dielectric-constant insulation film 116 and a cap insulation film 118 are successively film-made on the Cu-buried wiring 108 which was made, for example, by the single damascene method.

Next, the cap insulation film 118, the low dielectric-constant insulation film 116, the etching-stopper layer 114, the low dielectric-constant insulation film 112 and the etching-stopper layer 110 are etching processed such that a connecting aperture 119 is opened, and further the cap insulation film 118 and the low dielectric-constant insulation film 116 are etching processed such that a wiring groove 121 is opened.

Subsequently, a barrier metal film 120/a Cu plated thin film 122 are piled on the cap insulation film 118, and further a Cu layer is piled. Next, the Cu layer and the barrier metal film 120/the Cu plated thin film 122 are polished by a CMP method and the like, and a Cu-buried wiring 124 is formed.

It should be noted that in the damascene process, the photo-resist mask is removed by ashing processing the photo-resist mask after the insulation film is etching processed, but photo-resist residuals and its by-product polymer will remain after the ashing process. Unless removing those photo-resist residuals and polymer, there arises a problem that the resistance value between the upper and lower wiring patterns becomes high, the leak current between wirings on the same wiring layer increases and the like.

Consequently, the remaining photo-resist residuals and the by-product polymer are removed by performing a medicinal liquid washing process using a separation liquid composed of an alkaline separation-material or a fluorine compound as its main component.

However, the low dielectric-constant insulation film is easily oxidized or eroded by the alkaline medicinal liquid and additionally it might happen that the hygroscopic characteristic may become higher such that the dielectric constant increases. Consequently, the characteristic of the low dielectric-constant insulation film is deteriorated and there arises a problem that a desired performance of a semiconductor device cannot be obtained.

On the other hand, when a separation-material including fluorine ions is used, the low dielectric-constant film which is oxidized by the etching and ashing processes is eroded and etched by the separation-material including fluorine ions. In this operation a working dimension of the wiring pattern changes, so that there arises a problem that a short-circuit happens between the wirings adjacent each other with respect to up/down or right/left direction.

Further, in the above damascene process, when a stacking structure having a silicon oxide film on the low dielectric-constant insulation film is used as an insulation film, the low dielectric-constant insulation film is selectively eroded and etched, so that the wiring groove has eaves-shaped side walls such that the adherence of the barrier metal layer for the purpose of a diffusion prohibition of the wiring metal becomes insufficient and there is a problem that the wiring metal is diffused in the insulation film.

Additionally, the coverage of the Cu plated thin film becomes inadequate, so that there is a problem that a void where Cu is not piled will be produced.

For example, in the single damascene process, when the washing process is preformed by using a separation-material after forming the wiring groove 102, the low dielectric-constant insulation film 98 is eroded and has a retreat such that the bottom portion of the wiring groove 102 is spread as shown as a circular portion in FIG. 12A.

As a result, the coverage of the barrier metal film 106/the Cu plated thin film 106 becomes inadequate, so that there arises a problem that a void 126 where Cu is not piled in the wiring groove is produced and Cu diffuses to the low dielectric-constant insulation film 98.

Further, the dual damascene process also has similar problems as those of the single damascene process.

In the dual damascene process when the washing process is preformed using a separation-material after forming the contact hole 119 or the wiring groove 121, the low dielectric-constant insulation films 112 and 116 are eroded and have retreats as shown as an arrow A in FIG. 12B.

As a result, the coverage of the barrier metal film 120/the Cu plated thin film 122 becomes inadequate, so that as shown as an arrow B, there arises a problem that a void 128 where Cu is not piled in the wiring groove is produced and Cu diffuses to the low dielectric-constant insulation films 112 and 116.

For both of the single damascene process and the dual damascene process, this problem also becomes the same problem when an insulation film is etching processed by using a hard mask obtained by transferring a pattern of a photo-resist mask to a hard mask forming layer after the hard mask forming layer is film-made and the photo-resist mask is formed on the hard mask forming layer.

Further, when a buried wiring structure buried with Cu in a low dielectric-constant insulation film is formed by such as a dual damascene process and removing a photo-resist mask, portions C of the low dielectric-constant insulation films 112 and 116 which expose from a contact hole 119 and a wiring groove 121 as shown in FIG. 1A change in their quality if a conventionally widely-used amine family medicinal liquid such as a medicinal liquid of EKC 525 which is made by EKC company is used such that the dielectric constant increases.

Further, when a conventional $NH_4F$ family medicinal liquid is applied, the low dielectric-constant insulation films 112 and 116 are eroded and have retreats such that eaves shapes are formed by the projections of the etching stopper layer 114 and the cap insulation film 118 as shown in FIG. 1B. Therefore, the coverage of the barrier metal film 120 and the Cu plated thin film 122 becomes inadequate, so that areas are produced where the barrier metal layer 120 and the Cu thin film 122 cannot be piled. As a result, it happens that Cu diffuses to the low dielectric-constant insulation film and a void D of Cu is formed, so that the reliability of wiring is deteriorated and the incidence of sub-standard articles becomes higher.

As an alkaline separation-material has a disadvantage of eroding the low dielectric-constant insulation film as mentioned above, an acid separation-material composed of a calboxylic acid family acid as its main component is also commercially available instead of an alkaline separation-material.

Further, a separation-material composed of phosphonate as its main component is also commercially available for an acid separation-material. Japanese laid-open patent No. 2000-258924, for example, proposes a separation-material composition for a photo-resist containing an oxidant, a phosphonic acid family chelating material and a water-soluble fluorine compound and a separation method of the photo-resist thereof.

Additionally, Japanese laid-open patent No. 2001-345303 proposes a surface processing material using a phosphonate as a complexing agent and an organic alkaline as an organic solvent.

<Document of Patent: 1>
Japanese laid-open patent No. 2000-258924 (at page 2)

<Document of Patent: 2>
Japanese laid-open patent No. 2001-345303 (at page 3)

However, the conventional acid separation liquid has a problem for a practical use as explained hereinafter.

In more detail, an acid separation-material composed of a calboxylic acid family acid as its main component and an acid separation-material containing a phosphonic acid family chelating material have low separation abilities of a photo-resist, so that it is difficult to get a satisfactory separation effect in an actual production process.

Additionally, it is necessary to use the acid separation-material containing a phosphonate as a complexing agent in an alkaline area of pH 9 or more, so that there was a problem of a fear that the low dielectric-constant film might change in its quality in the atmosphere of the alkaline area. Further, the concentration of the phosphonate is very low in a range of 1 to 1000 weight ppm, so that the photo-resist separation ability and the polymer removing ability are deemed to be low and it is difficult to get a satisfactory separation effect in an actual production process.

In the above explanation, problems of the separation-material composition for the photo-resist were explained raising the examples of the damascene process, but these are not limited to the damascene process and are also the same problems in general removals of photo-resist masks.

SUMMARY OF THE INVENTION

In view of the aforementioned aspect, it is an object of the present invention to propose a separation-material composition for a photo-resist and a manufacturing method of semiconductor device using thereof where the residuals of the photo-resist used such as for dry-etching and the by-product polymer can be easily removed and at the same time the separation-material composition is constituted by a component composition not to oxidize or erode the low dielectric-constant insulation film.

The inventors of the present invention obtained the following conclusions in order to attain the above object after various investigations and experiments:

(1) It is necessary to use an acid separation-material instead of an alkaline separation-material which will erode the low dielectric-constant insulation film, but a conventional acid separation-material is poor in the separation characteristic of the photo-resist. Consequently, other acid materials instead of the conventional acid of the calboxylic acid family or oxalic acid family were examined and as a result, sulfamic acid and phosphonic acid were found to be very much effective. By using the sulfamic acid or phosphonic acid as a main component, it becomes possible to separate the photo-resist and the polymer under a condition of suppressing the increase of the dielectric constant and the performance deterioration of the low dielectric-constant insulation film by corrosion and etching and the like.

The content of the sulfamic acid or phosphonic acid is desirable to be in a range from 0.1 weight % or more to 20 weight % or less and is more desirable to be in a range from 0.5 weight % or more to 15 weight % or less.

When it is in a range less than 0.1 weight %, the separation removing capability of the photo-resist film, the photo-resist residuals and the polymer is decreased and when it becomes over 20 weight %, the corrosion tendency becomes stronger, so that such a range of weight % is not desirable.

(2) By additively using a water-soluble organic solvent which has an excellent dissolve-removing ability with respect to the photo-resist and the polymer, the removing capability of the photo-resist and the polymer becomes higher.

The water-soluble organic solvent can be formed by a single type or by a compound one of 2 or more types. The content of the water-soluble organic solvent is desirable to be in a range from 30 weight % or more to 95 weight % or less and especially desirable to be in a range from 50 weight % or more to 90 weight % or less. When the content of the water-soluble organic solvent is less than 30 weight %, the removing characteristic of the photo-resist, the photo-resist residuals and the polymer becomes low and when it becomes over 95 weight %, the density of the sulfamic acid or the phosphonic acid relatively decreases such that the dissolving removing capability of the photo-resist residuals and the polymer decreases and those are not acceptable or desirable.

The separation-material composition for the photo-resist provided with or satisfying (1) and (2) can separate the photo-resist and the polymer in a condition of suppressing the erosion and the performance down of the low dielectric-constant insulation film owing to the sulfamic acid or the phosphonic acid while at the same time the photo-resist and the polymer can be effectively dissolve-removed owing to the water-soluble organic solvent.

(3) By including salt (also designated as salt specified by the present invention hereinafter) formed by hydroacid fluoride and a base which does not include a metal, the separation ability of the photo-resist and the polymer can be made higher.

The content of the salt specified by the present invention is desirable to be in a range from 0.01 weight % or more to 10 weight % or less and especially desirable to be in a range from 0.05 weight % or more to 5 weight % or less. When it is in a range less than 0.01 weight %, there is no effect for improving the separation removing capability of the photo-resist film and the photo-resist residuals and when it becomes over 10 weight %, the corrosion tendency becomes stronger with respect to the wiring material, the low dielectric-constant insulation film and the like, so that such a range of weight % is not desirable.

A Separation-Material Composition for a Photo-Resist According to a First Invention To realize the purpose based on the aforementioned understanding, the separation-material composition for the photo-resist according to the present invention (designated as a first invention hereinafter) is characterized by a separation-material composition for a photo-resist including at least sulfamic acid ($NH_2SO_3H$) and water where a photo-resist mask having a photo-resist pattern is formed on an under-layer and the separation-material composition for the photo-resist is used for removing the photo-resist mask after the under-layer is subsequently processed by using the photo-resist mask.

So long as the photo-resist mask is made by a photo-resist material which can be removed by an ashing process, the separation-material composition for the photo-resist according to the first invention and a second invention described hereinafter can be adopted regardless of its composition and especially in a manufacturing process of a semiconductor device it can effectively separation-remove the photo-resist mask, the photo-resist residuals and the by-product polymer and at the same time it has an excellent erosion prohibition characteristic especially with respect to a Low-k film.

According to the separation-material composition for the photo-resist of the first invention, it becomes easy to separate the photo-resist residuals and the by-product polymer by making sulfamic acid included. Additionally, the separated photo-resist residuals and by-product polymer can be dissolved or suspended into water which is a component of the separation-material composition for the photo-resist.

The content of the sulfamic acid is desirable to be in a range from 0.1 weight % or more to 20 weight % or less.

According to a preferred exemplified embodiment of the first invention, water-soluble organic solvent is additionally included and the content of the water-soluble organic solvent is made to be in a range from 30 weight % or more to 95 weight % or less. The water-soluble organic solvent can be formed by a single type or by a compound type of 2 or more organic solvents.

In this way the dissolving operation of the separated residuals of the photo-resist mask and the by-product polymer is progressed, so that the separation removing operation becomes easy.

As a water-soluble organic solvent which can be included in the separation-material composition for the photo-resist according to the first invention, it can be listed up such as, for example, amide family, pyrrolidone family, alkyl urea family, sulfoxide family, imidazolidinone family, polyhydric alcohol family and its derivatives, lactone family, calboxylic acid derivative family and the like.

As the amide family used for the water-soluble organic solvent of the separation-material composition for the photo-resist according to the first invention, it can be listed up such as N-methylfolmamide, N,N-dimethylfolmamide, N-ethylfolmamide, N,N-diethylfolmamide, N-methylacetamide, N,N-dimethylacetamide, N,N-diethylacetamide and the like.

As the pyrrolidone family, it can be listed up such as N-methyl 2-pyrrolidone, N-ethyl-2-pyrrolidone, N-hydroxyethyl-2-pyrrolidone, N-cyclohexyl-2-pyrrolidone and the like.

As the alkyl urea family it can be listed up such as tetramethyl urea, tetraethyl urea and the like.

As the sulfoxide family, it can be listed up such as dimethyl sulfoxide, diethyl sulfoxide and the like.

As the imidazolidinone family, it can be listed up such as 1,3-dimethyl-2-imidazoli2-imidazolidinone, 1,3-diethyl-2-imidazolidinone and the like.

As the polyhydric alcohol family and its derivatives, it can be listed up such as ethylene glycol, ethylene glycol monomethyl ether, ethylene glycol monoethyl ether, ethylene glycol monopropyl ether, ethylene glycol monobuthyl ether, ethylene glycol monomethyl ether acetate, ethylene glycol monoethyl ether acetate, ethylene glycol monopropyl ether acetate, ethylene glycol monobuthyl ether acetate, diethylene glycol, diethylene glycol monomethyl ether, diethylene glycol monoethyl ether, diethylene glycol monopropyl ether, diethylene glycol monobuthyl ether, diethylene glycol monomethyl ether acetate, diethylene glycol monoethyl ether acetate, diethylene glycol monopropyl ether acetate, diethylene glycol monobuthyl ether acetate, triethylene glycol monomethyl ether, propylene glycol, propylene glycol monomethyl ether, propylene glycol monoethyl ether, propylene glycol monopropyl ether, propylene glycol monobuthyl ether, dipropylene glycol monomethyl ether, dipropylene glycol monoethyl ether, dipropylene glycol monopropyl ether, dipropylene glycol monobuthyl ether, dipropylene glycol monomethyl ether acetate, dipropylene glycol monoethyl ether acetate, dipropylene glycol monopropyl ether acetate, diethylene glycol monobuthyl ether acetate, diethylene glycol dimethyl ether, diethylene glycol diethyl ether, diethylene glycol dipropyl ether, diethylene glycol dibuthyl ether, dipropylene glycol dimethyl ether, dipropylene glycol diethyl ether, dipropylene glycol dipropyl ether, dipropylene glycol dibuthyl ether and the like.

According to a preferred exemplified embodiment of the first invention, salt (designated as specific salt by the first invention hereinafter) formed by hydroacid fluoride and a base which does not include a metal is additionally included and the content of the salt specified by the present invention is in a range from 0.01 weight % or more to 10 weight % or less.

It is desirable for the salt formed by hydroacid fluoride and a base which does not include a metal to select the molar ratio of the hydroacid fluoride and the base which does not include a metal is in a range from 1:0.1 or more to 1:10 or less.

In this way, the separation ability of the photo-resist mask residuals and the by-product polymer is more improved.

For the base which does not include a metal it can be listed up such as, for example, hydroxyamine family; first class, second class or third class aliphatic amine; alicyclic amine; aromatic amine; organic amine such as heterocyclic amine; ammonia, lower alkyl fourth class ammonium-base and the like.

For the hydroxyamine family used for the separation-material composition for the photo-resist, it can be listed up such as hydroxyamine, N,N-diethylhydroxyamine and the like.

For the aliphatic first class amine, it can be listed up such as methylamine, ethylamine, propylamine, buthylamine, monoethanolamine, monoisopropanol amine, 2-(2-amino ethylamino)ethanol and the like.

For the aliphatic second class amine, it can be listed up such as dimethylamine, diethylamine, dipropylamine, dibuthylamine, diethanolamine, diisopropanolamine, N-methylethanolamine, N-ethylethanolamine and the like.

For the third class amine, it can be listed up such as trimethylamine, triethylamine, tripropylamine, tributhylamine, triethanolamine, N,N-dimethylethanolamine, N,N-diethylethanolamine, N-methyldiethanolamine, N-ethyldiethanolamine and the like.

For the alicyclic amine, it can be listed up such as cyclohexylamine, dicyclohexylamine and the like.

For the aromatic amine, it can be listed up such as benzylamine, dibenzylamine, N-methyl benzylamine, N-ethyl benzylamine, N,N-dimethylbenzylamine, N,N-diethylbenzylamine and the like.

For the heterocyclic amine, it can be listed up such as pyrrole, pyrrolidine, pyridine, morpholine, pyrazine, piperidine, oxazole, thiazole and the like.

For the lower alkyl fourth class ammonium-base, it can be listed up such as tetramethyl ammonium hydroxide, tetraethyl ammonium hydroxide, tri(2-hydroxyethyl)ammonium hydroxide and the like.

A Manufacturing Method of a Semiconductor Device Washed by Using a Separation-Material Composition for a Photo-Resist According to the First Invention A manufacturing method of a semiconductor device according to the present invention (designated as a first invented method hereinafter) comprises a process for forming a photo-resist mask having a photo-resist pattern on an under-layer and for processing the under-layer subsequently by using the photo-resist mask, and a washing process for washing processing the processed under-layer by using a separation-material composition for a photo-resist such that at least one of the photo-resist mask residuals and the by-product polymer is separated and removed, wherein a separation-material composition for a photo-resist which includes at least sulfamic acid ($NH_2SO_3H$) and water is used as the separation-material composition for the photo-resist.

Another manufacturing method of a semiconductor device according to the present invention (designated as a second invented method hereinafter) comprises a process for forming a photo-resist mask having a photo-resist pattern on an under-layer and for processing the under-layer subsequently by using the photo-resist mask, and an ashing process for ashing processing so as to remove the photo-resist mask, and a washing process for washing processing the processed under-layer by using a separation-material composition for a photo-resist such that at least one of the photo-resist mask residuals and the by-product polymer residuals are separated and removed, wherein a separation-material composition for a photo-resist which includes at least sulfamic acid ($NH_2SO_3H$) and water is used as the separation-material composition for the photo-resist.

According to the first invented method, the photo-resist mask and the by-product polymer are removed by the separation-material composition for the photo-resist according to the first invention without ashing processing the photo-resist mask. On the other hand, according to the second invented method, the photo-resist mask is mostly removed by the ashing process and the photo-resist mask residuals and the by-product polymer are subsequently removed by the separation-material composition for the photo-resist according to the present invention.

According to the first and second invented methods, the purpose of using the photo-resist mask is not requested or limited, that is, it can be used as an etching mask for dry-etching and also can be used as a mask for ion injection.

For the process for processing the under-layer, for example, any of the following processes (1), (2) and (3) can be used:

(1) An insulation film is film-made as the under-layer on a semiconductor substrate and a photo-resist mask having a photo-resist pattern of a wiring groove or a connecting aperture as the photo-resist mask is subsequently formed on the insulation film, and the insulation film is dry-etching processed such that a wiring groove or a connecting aperture having a predetermined pattern is formed.

(2) An etching-stopper layer having a metal diffusion prohibiting effect is film-made as the under-layer on a lower layer wiring, a photo-resist mask having a photo-resist pattern of a connecting aperture as the photo-resist mask is subsequently formed on the etching-stopper layer, and a connecting aperture which reaches the lower layer wiring is formed at the etching-stopper layer by subsequently dry-etching the etching-stopper layer.

(3) A metal film is film-made as the under-layer on a semiconductor substrate, a photo-resist mask having a photo-resist pattern of a wiring as the photo-resist mask is subsequently formed on the metal film, and a photo-resist mask having a photo-resist pattern of a wiring is subsequently formed by dry-etching the metal film.

For the process for processing the under-layer, the insulation film is, for example, a silicon oxide film, a low dielectric-constant insulation film, a stacked insulation film having a low dielectric-constant insulation film and the like; the etching-stopper layer having a metal diffusion prohibiting effect is a silicon nitride film or a silicon carbide film; and the metal film is an aluminum film or an aluminum-alloy film.

Furthermore, the technical concept of the first and second invented methods is also applicable to an etching process using a hard mask.

In more detail, still another manufacturing method of a semiconductor device according to the present invention (designated as a third invented method hereinafter) comprises a process for film-making a hard mask forming layer on an under-layer; a process for forming a photo-resist mask having a photo-resist pattern on the hard mask forming layer, for subsequently etching the hard mask forming layer by using the photo-resist pattern and for forming a hard mask transferred with the photo-resist pattern; a process for subsequently processing the under-layer by using the hard mask; and a washing process for washing processing the processed under-layer by using a separation-material composition for a photo-resist such that at least one of the photo-resist mask residuals and the by-product polymer is separated and removed; wherein a separation-material composition for a photo-resist which includes at least sulfamic acid ($NH_2SO_3H$) and water is used as the separation-material composition for the photo-resist.

A Separation-Material Composition for a Photo-Resist According to a Second Invention Based on the aforementioned understanding, the separation-material composition for the photo-resist according to the present invention (designated as a second invention hereinafter) is characterized by a separation-material composition for a photo-resist which is a water solution including at least phosphonic acid ($H_2PHO_3$) and a water-soluble organic solvent where a photo-resist mask having a photo-resist pattern is formed on an under-layer and the separation-material composition for the photo-resist is used for removing the photo-resist mask after the under-layer is subsequently processed by using the photo-resist mask.

According to the separation-material composition for the photo-resist of the second invention, it becomes easy to separate the photo-resist residuals and the by-product polymer by making phosphonic acid included. Additionally, the separated photo-resist residuals and by-product polymer can be dissolved or suspended into water which is a component of the separation-material composition for the photo-resist.

In a preferred exemplified embodiment of the second invention, the content of the phosphonic acid is selected between 0.1 weight % or more and 30 weight % or less, and the content of the water-soluble organic solvent is selected between 30 weight % or more and 95 weight % or less. In this way, the separated residuals of the photo-resist mask and by-product polymer are progressively dissolved and the separation removing operation thereof becomes easy.

The water-soluble organic solvent used for the separation-material composition for the photo-resist according to the second invention is same as the water-soluble organic solvent used for the separation-material composition for the photo-resist according to the first invention. Additionally, the water-soluble organic solvent can be formed by a single type or by a compound type of 2 or more organic solvents similarly as the first invention.

The separation-material composition for the photo-resist according to the second invention is a water solution including phosphonic acid and a water-soluble organic solvent, so that when forming a wiring structure by a damascene process, removal of the photo-resist film after the dry etching and removal of the photo-resist residuals and polymer after the ashing process are more effectively performed as compared with a conventional separation-material composition for a photo-resist and at the same time, it has an excellent erosion prohibiting characteristic with respect to a copper wiring, insulation film and especially to a low dielectric-constant film.

Additionally, the separation-material composition for the photo-resist according to the second invention has a higher removing performance in connection with the photo-resist film and the photo-resist residuals when washing after the dry etching and washing after the dry etching of the oxide film are performed in case of forming a conventional aluminum wiring as compared with a conventional separation-material composition for a photo-resist.

In a preferred exemplified embodiment of the second invention, salt formed by hydroacid fluoride and a base which does not include a metal (designated as a specified salt of the second invention) are further contained additively to the water solution including the phosphonic acid ($H_2PHO_3$) and the water-soluble organic solvent. For the specified salt of the second invention, the molar ratio of the hydroacid fluoride and the base which does not include a metal is in a range from 1:0.1 or more to 1:10 or less and the content of the salt formed by hydroacid fluoride and a base which does not include a metal is in a range from 0.01 weight % or more to 10 weight % or less.

It should be noted that the specified salt of the second invention used for the separation-material composition for the photo-resist according to the second invention is same as the specified salt of the first invention used for the separation-material composition for the photo-resist according to the first invention.

A Manufacturing Method of a Semiconductor Device Washed by Using a Separation-Material Composition for a Photo-Resist According to the Second Invention Still another manufacturing method of a semiconductor device according to the present invention (designated as a fourth invented method hereinafter) comprises a process for forming a photo-resist mask having a photo-resist pattern on an under-layer and for processing the under-layer subsequently by using the photo-resist mask, and a washing process for washing processing the processed under-layer by using a separation-material composition for a photo-resist such that at least one of the photo-resist mask residuals and the by-product polymer is separated and removed, wherein the separation-material composition for the photo-resist is a water solution including at least phosphonic acid ($H_2PHO_3$) and a water-soluble organic solvent.

Still another manufacturing method of a semiconductor device according to the present invention (designated as a fifth invented method hereinafter) comprises a process for forming a photo-resist mask having a photo-resist pattern on an under-layer and for processing the under-layer subsequently by using the photo-resist mask, and an ashing process for ashing processing so as to remove the photo-resist mask, and a washing process for washing processing the processed under-layer by using a separation-material composition for a photo-resist such that at least one of the photo-resist mask residuals and the by-product polymer residuals are separated and removed, wherein the separation-material composition for the photo-resist is a water solution including at least phosphonic acid ($H_2PHO_3$) and a water-soluble organic solvent.

According to the fourth invented method, the photo-resist mask and the by-product polymer are removed by the separation-material composition for the photo-resist according to the second invention without ashing processing the photo-resist mask. On the other hand, according to the fifth invented method, the photo-resist mask is mostly removed by the ashing process and the photo-resist mask residuals and the by-product polymer are subsequently removed by the separation-material composition for the photo-resist according to the second invention.

According to the fourth and fifth invented methods, the purpose of using the photo-resist mask is not requested or limited, that is, it can be used as an etching mask for dry-etching and also can be used as a mask for ion injection.

For the process for processing the under-layer of the fourth and fifth methods, for example, any of the following processes (1) (2) and (3) can be use:

(1) An insulation film is film-made as the under-layer on a semiconductor substrate and a photo-resist mask having a photo-resist pattern of a wiring groove or a connecting aperture as the photo-resist mask is subsequently formed on the insulation film, and the insulation film is dry-etching processed such that a wiring groove or a connecting aperture having a predetermined pattern is formed.

(2) An etching-stopper layer having a metal diffusion prohibiting effect is film-made as the under-layer on a lower layer wiring, a photo-resist mask having a photo-resist pattern of a connecting aperture as the photo-resist mask is subsequently formed on the etching-stopper layer, and a connecting aperture which reaches the lower layer wiring is formed at the etching-stopper layer by subsequently dry-etching the etching-stopper layer.

(3) A metal film is film-made as the under-layer on a semiconductor substrate, a photo-resist mask having a photo-resist pattern of a wiring as the photo-resist mask is subsequently formed on the metal film, and a photo-resist mask having a photo-resist pattern of a wiring is subsequently formed by dry-etching the metal film.

For the process for processing the under-layer, the insulation film is, for example a silicon oxide film, a low dielectric-constant insulation film, a stacked insulation film having a low dielectric-constant insulation film and the like; the etching-stopper layer having a metal diffusion prohibiting effect is a silicon nitride film or a silicon carbide film; and the metal film is an aluminum film or an aluminum-alloy film.

Furthermore, the technical concept of the fourth and fifth invented methods is also applicable to an etching process using a hard mask as a sixth invented method.

In more detail, still another manufacturing method of a semiconductor device according to the present invention (designated as a sixth invented method hereinafter) comprises a process for film-making a hard mask forming layer on an under-layer; a process for forming a photo-resist mask having a photo-resist pattern on the hard mask forming layer, for subsequently etching the hard mask forming layer by using the photo-resist pattern and for forming a hard mask transferred with the photo-resist pattern; a process for subsequently processing the under-layer by using the hard mask; and a washing process for washing processing the processed under-layer by using a separation-material composition for a photo-resist such that at least one of the photo-resist mask residuals and the by-product polymer is separated and removed; wherein the separation-material composition for the photo-resist is a water solution including at least phosphonic acid ($H_2PHO_3$) and a water-soluble organic solvent.

DESCRIPTION OF THE PREFERRED EMBODIMENTS

Figure 1A:
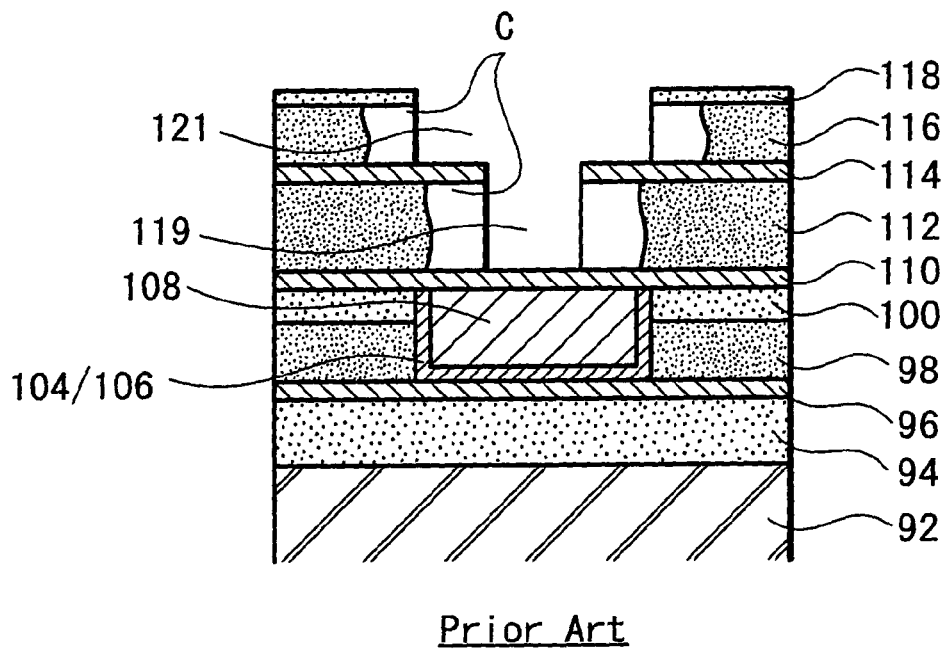
FIGS. 1A and 1B are cross-sectional views respectively explaining a problem when a conventional separation-material for a photo-resist is used for forming a buried wiring structure of a multi-layer type according to a dual damascene structure.

The present invention will be explained in detail based on exemplified practical embodiments with reference to the drawings.

An Exemplified Practical Embodiment 1 of a Separation-Material Composition for a Photo-Resist This exemplified practical embodiment is one example of a separation-material composition for a photo-resist according to the first invention. The separation-material composition for the photo-resist according to this exemplified practical embodiment is a separation-material composition for a photo-resist composed of 5.0 weight % of sulfamic acid, 34.7 weight % of H$_2$O, 0.3 weight % of ammonium 1-hydrogen difluoride, 30 weight % of N,N-dimethylacetamide and 30 weight % of diethylene glycol mono-n-butyl ether.

The separation-material composition for the photo-resist according to this exemplified practical embodiment is mainly used as a medicinal liquid washing liquid/scientific liquid for removing photo-resist residuals and by-product polymer residuals after ashing processing a photo-resist mask.

With reference to a conventional separation-material composition composed of amine as a main component, a conventional separation-material composition composed of NH$_4$F as a main component, a conventional separation-material composition composed of oxalic acid as a main component and a separation-material composition for a photo-resist of the exemplified practical embodiment 1, removing capability of the photo-resist residuals, removing capability of the by-product polymer, performance deterioration or non-deterioration by the hygroscopic characteristic of the low dielectric-constant insulation film and whether the retreat amount of the low dielectric-constant insulation film is large or small are selected as evaluation items and experiments are conducted a lot of times, so that a result is obtained as shown in table 1.

TABLE 1

|  | Sample 1 | Sample 2 | Sample 3 | Sample 4 |
| --- | --- | --- | --- | --- |
| Separation of Photo-resist Residuals | X | ◯ | X | ◯ |
| Separation of Polymer Residuals | ◯ | ◯ | ◯ | ◯ |
| Quality Change (Hygroscopicity Deterioration) of Low Dielectric-Constant Insulation Film | X | ◯ | ◯ | ◯ |
| Retreat Amount of Low Dielectric-Constant Insulation Film Insulation Film | ◯ | X | ◯ | ◯ |

Sample 1: Conventional Separation Material Composition for Photo-resist Composed of Amine as Main Component
Sample 2: Conventional Separation Material Composition for Photo-resist Composed of NH4F as Main Component
Sample 3: Conventional Separation Material Composition for Photo-resist Composed of Oxalic Acid as Main Component
Sample 4: Separation Material Composition for Photo-resist of Exemplified Practical Embodiment 1

As seen in the table 1, the separation-material composition for the photo-resist of the exemplified practical embodiment (Sample 4) has excellent characteristics in all the evaluation items while conventional separation-material compositions for the photo-resist have defects at least in some of the evaluation items.

For the conventional separation-material compositions for the photo-resist it was difficult to obtain the removing capability of photo-resist residuals and polymer residuals and at the same time to suppress the performance deterioration and the retreat amount caused by the phenomenon that the hygroscopic characteristic of the low dielectric-constant film becomes higher, but by using a separation-material composition for a photo-resist according to this exemplified practical embodiment, it becomes possible to remove the photo-resist residuals and polymer residuals and at the same time to suppress the performance deterioration and the retreat amount caused by the phenomenon that the hygroscopic characteristic of the low dielectric-constant film becomes higher.

An Exemplified Practical Embodiment 2 of a Separation-Material Composition for a Photo-Resist This exemplified practical embodiment is another example of a separation-material composition for a photo-resist according to the first invention. The separation-material composition for the photo-resist according to this exemplified practical embodiment is a separation-material composition for a photo-resist composed of 1.0 weight % of sulfamic acid, 18.8 weight % of $H_2O$, 0.2 weight % of ammonium 1-hydrogen difluoride, 20 weight % of N,N-dimethylacetamide and 60 weight % of diethylene glycol mono-n-buthyl ether.

The separation-material composition for the photo-resist according to this exemplified practical embodiment is mainly used as a medicinal liquid washing liquid/scientific liquid for removing the photo-resist mask and the by-product polymer by eliminating an ashing process after the under-layer is processed instead of by ashing processing, that is, by the photo-resist mask.

As explained hereinafter in connection with an exemplified practical embodiment for a manufacturing method of a semiconductor device, it is possible for a separation-material composition for a photo-resist according to this exemplified practical embodiment to completely remove the photo-resist mask and the by-product polymer while at the same time it does not have a bad influence on the low dielectric-constant insulation film.

An Exemplified Practical Embodiment 3 of a Separation-Material Composition for a Photo-Resist This exemplified practical embodiment is still another example of a separation-material composition for a photo-resist according to the first invention. The separation-material composition for the photo-resist according to this exemplified practical embodiment is a separation-material composition for a photo-resist composed of 2.5 weight % of sulfamic acid, 36.5 weight % of $H_2O$, 1.0 weight % of ammonium 1-hydrogen difluoride, 30 weight % of N,N-dimethylacetamide and 30 weight % of diethylene glycol monomethyl ether.

The separation-material composition for the photo-resist according to this exemplified practical embodiment is mainly used as a medicinal liquid washing liquid/scientific liquid for removing the photo-resist residuals and the by-product polymer residuals after ashing processing a photo-resist mask where a similar effect can be obtained as for a separation-material composition for a photo-resist of the exemplified practical embodiment 1.

An Exemplified Practical Embodiment 4 of a Separation-Material Composition for a Photo-Resist This exemplified practical embodiment is an example of a separation-material composition for a photo-resist according to the second invention. The separation-material composition for the photo-resist according to this exemplified practical embodiment is a separation-material composition for a photo-resist which is composed of 1-hydroxyethylidene-1, 3.0 weight % of 1-diphosphonic acid, 0.12 weight % of anmonium fluoride, 48.38 weight % of $H_2O$ and 48.5 weight % of diethylene glycol mono-n-buthl ether.

The separation-material composition for the photo-resist according to this exemplified practical embodiment is mainly used as a medicinal liquid wash-processing liquid for removing the photo-resist residuals and the by-product polymer residuals after ashing processing a photo-resist mask.

With reference to a conventional separation-material composition composed of amine as a main component, a conventional separation-material composition composed of $NH_4F$ as a main component, a conventional separation-material composition composed of oxalic acid as a main component and a separation-material composition for a photo-resist of the exemplified practical embodiment 1, removing capability of the photo-resist residuals, removing capability of the by-product polymer, performance deterioration or non-deterioration by the hygroscopic characteristic of the low dielectric-constant insulation film and whether the retreat amount of the low dielectric-constant insulation film is large or small are selected as evaluation items and experiments are conducted a lot of times, so that a result is obtained as shown in table 2.

TABLE 2

|  | Sample 1 | Sample 2 | Sample 3 | Sample 4 |
|---|---|---|---|---|
| Separation of Photo-resist Residuals | X | ○ | X | ○ |
| Separation of Polymer Residuals | ○ | ○ | ○ | ○ |
| Quality Change (Hygroscopicity Deterioration) of Low Dielectric-Constant Insulation Film | X | ○ | ○ | ○ |
| Retreat Amount of Low Dielectric-Constant Insulation Film Insulation Film | ○ | X | ○ | ○ |

Sample 1: Conventional Separation Material Composition for Photo-resist Composed of Amine as Main Component
Sample 2: Conventional Separation Material Composition for Photo-resist Composed of NH4F as Main Component
Sample 3: Conventional Separation Material Composition for Photo-resist Composed of Oxalic Acid as Main Component
Sample 4: Separation Material Composition for Photo-resist of Exemplified Practical Embodiment 4

As seen in the table 2, the separation-material composition for the photo-resist of the exemplified practical embodiment (Sample 5) of the exemplified practical embodiment 1 has excellent characteristics in all the evaluation items while conventional separation-material compositions for the photo-resist have defects at least in some of the evaluation items.

For the conventional separation-material compositions for the photo-resist it was difficult to obtain the removing capability of photo-resist residuals and polymer residuals and at the same time to suppress the performance deterioration and the retreat amount caused by the phenomenon that the hygroscopic characteristic of the low dielectric-constant film becomes higher, but by using a separation-material composition for a photo-resist according to this exemplified practical embodiment, it becomes possible to remove the photo-resist residuals and polymer residuals and at the same time to suppress the performance deterioration and the retreat amount caused by the phenomenon that the hygroscopic characteristic of the low dielectric-constant film becomes higher.

An Exemplified Practical Embodiment 5 of a Separation-Material Composition for a Photo-Resist This exemplified practical embodiment is another example of a separation-material composition for a photo-resist according to the second invention. The separation-material composition for the photo-resist according to this exemplified practical embodiment is a separation-material composition for a photo-resist which is composed of 1-hydroxyethylidene-1, 12.0 weight % of 1-diphosphonic acid, 0.17 weight % of ammonium 1-hydrogen difluoride, 27.83 weight % of H₂O, 30.0 weight % of diethylene glycol mono-n-buthl ether and 30.0 weight % of N,N-dimethylacetamide.

The separation-material composition for the photo-resist according to this exemplified practical embodiment is mainly used as a medicinal liquid washing liquid/scientific liquid for removing the photo-resist mask and the by-product polymer by eliminating an ashing process after the under-layer is processed instead of by an ashing process, that is, by the photo-resist mask.

As explained hereinafter in connection with an exemplified practical embodiment for a manufacturing method of a semiconductor device, it is possible for a separation-material composition for a photo-resist according to this exemplified practical embodiment to completely remove the photo-resist mask and the by-product polymer while at the same time it does not have a bad influence on the low dielectric-constant insulation film.

An Exemplified Practical Embodiment 6 of a Separation-Material Composition for a Photo-Resist This exemplified practical embodiment is still another example of a separation-material composition for a photo-resist according to the second invention. The separation-material composition for the photo-resist according to this exemplified practical embodiment is a separation-material composition for a photo-resist which is composed of 1-hydroxyethylidene-1, 9.0 weight % of 1-diphosphonic acid, 42.5 weight % of H₂O and 48.5 weight % of diethylene glycol mono-n-buthl ether.

The separation-material composition for the photo-resist according to this exemplified practical embodiment is mainly used as a medicinal liquid wash-processing liquid for removing the photo-resist residuals and the by-product polymer residuals after ashing processing a photo-resist mask where a similar effect can be obtained as for a separation-material composition for a photo-resist of the exemplified practical embodiment 4.

A manufacturing method of a semiconductor device using a separation-material composition for a photo-resist according to the first invention is described hereinafter. However, it should be noted that the method of the present invention is not limited by these exemplified practical embodiments. It should also be noted that film types, film thicknesses, film-making methods and others such as dimensions shown in the exemplified practical embodiments below are just exemplified indications and the present invention is not limited by those exemplified indications.

An Exemplified Practical Embodiment 1 of a Manufacturing Method of a Semiconductor Device This exemplified practical embodiment is an example of a practical embodiment of a manufacturing method of a semiconductor device with reference to the second invented method, and FIGS. 2A to 2C, FIG. 3D and FIG. 3E are cross-sectional views of processes respectively when a single damascene process is applied according to the method of this exemplified practical embodiment.

According to this exemplified practical embodiment, a Cu-buried wiring is formed by a single damascene process on a semiconductor substrate on which a semiconductor device such as a transistor (not shown) is formed in advance.

Figure 2A:
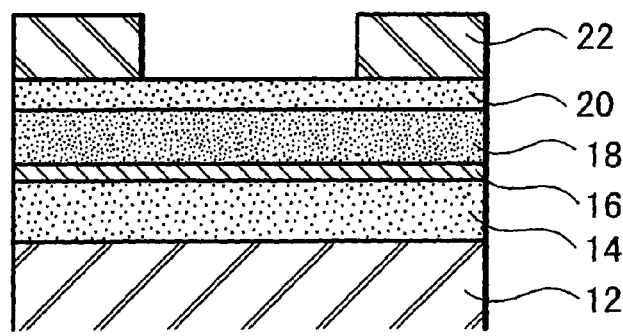
FIGS. 2A to 2C are cross-sectional views respectively showing each of processes when a single damascene process is applied according to a method of an exemplified practical embodiment 1 or 7.

First, as shown in FIG. 2A, an etching-stopper layer 16 is film-made by a reduced pressure CVD method and the like by piling silicon nitride (SiN) on an insulation film 14 which is film-made on a semiconductor substrate 12, and a low dielectric-constant (low-k) insulation film 18 and a cap insulation film 20 are successively piled on the etching-stopper layer 16 by means of a CVD method and the like.

Next, a photo-resist mask 22 having a desired wiring groove pattern is formed.

Figure 2B:
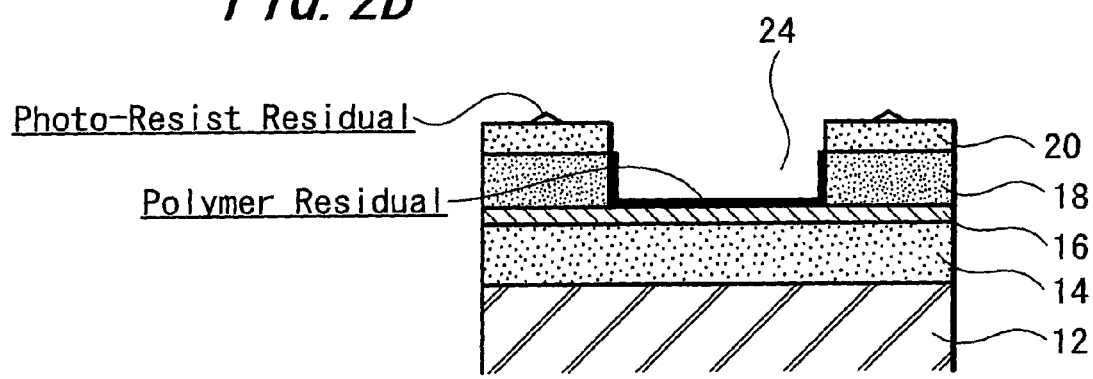

Subsequently, as shown in FIG. 2B, the cap insulation film 20 and the low dielectric-constant insulation film 18 are etching processed from the upper side of the photo-resist mask 22 and this etching process is stopped at the surface of the etching-stopper layer 16 such that a wiring groove 24 is formed. An ashing process is subsequently performed so as to separate the photo-resist mask 22.

When the photo-resist mask 22 is separated by the ashing process, photo-resist residuals remain on the cap insulation film 20 and additionally, polymer residuals are produced in the wiring groove 24 as shown in FIG. 2B.

Consequently, according to this exemplified practical embodiment, a medicinal liquid washing process which uses the separation-material composition for the photo-resist of the exemplified practical embodiment 1 is performed for 300 seconds at the insulation film stacking structure formed by the wiring groove pattern 24 so as to remove the photo-resist residuals and the polymer residuals, and subsequently a pure water rinsing process and a successive drying process are performed according to a conventional method.

The separation-material composition for the photo-resist used for the medicinal liquid washing process is the separation-material composition for the photo-resist of the exemplified practical embodiment 1 which is composed of 5.0 weight % of sulfamic acid, 34.7 weight % of H₂O, 0.3 weight % of ammonium 1-hydrogen difluoride, 30 weight % of N,N-dimethylacetamide and 30 weight % of diethylene glycol mono-n-buthyl ether.

Figure 2C:
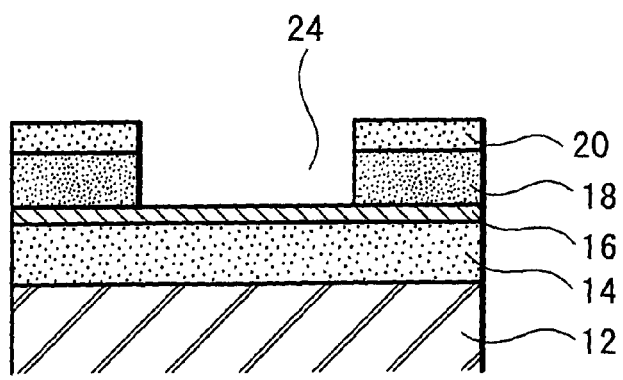

In this exemplified practical embodiment, the medicinal liquid washing process is performed by using the separation-material composition for the photo-resist according to the exemplified practical embodiment 1, so that the photo-resist residuals are nearly completely removed from the top of the cap insulation film 20 and further the polymer residuals are also nearly completely removed from the wiring groove 24 as shown in FIG. 2C.

In this case it should be noted that it can be avoided from a phenomenon that the performance of the low dielectric-constant film is deteriorated and the width of the wiring groove is widened which will happen when a conventional separation-material composition for the photo-resist is used.

Figure 3D:
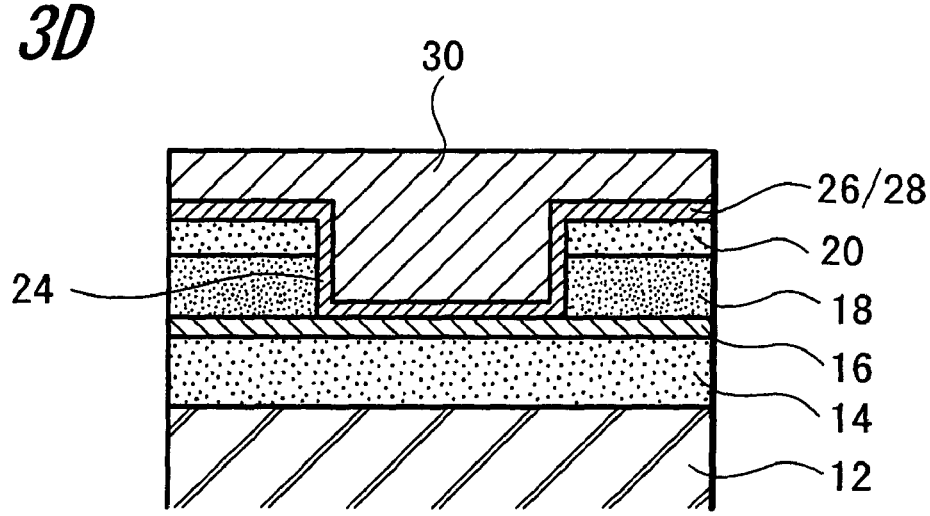
FIGS. 3D and 3E are cross-sectional views respectively showing each of processes when a single damascene process is applied succeeding to FIG. 2C according to a method of an exemplified practical embodiment 1 or 7.

Next, as shown in FIG. 3D, a metal film 26 such as TaN and a Cu plated thin film 28 are film-made on the whole surface of the substrate by, for example, a sputtering method for the purpose of a wiring metal diffusion prohibition, and a conductive wiring layer 30 such as copper (Cu) is subsequently piled in the wiring groove 24 by, for example, a plating method so as to bury the wiring groove 24.

Figure 3E:
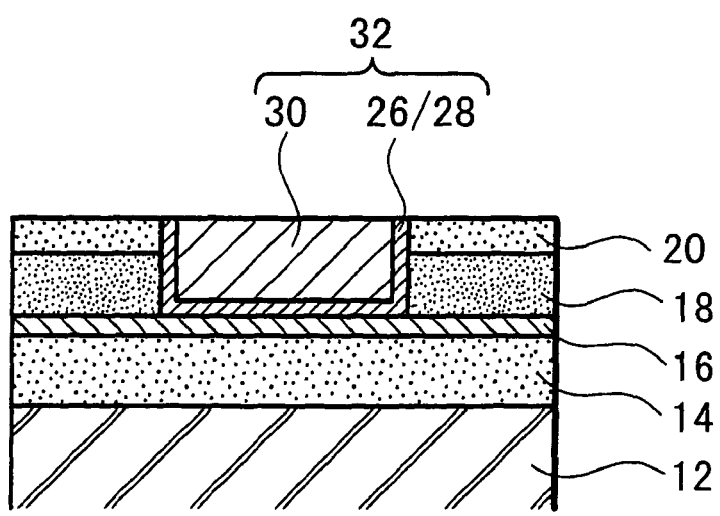

Next, as shown in FIG. 3E, the wiring layer 30, the metal film 26 and the Cu thin film 28 which were piled outside of the wiring groove 24 are removed by a CMP method and the like so as to form a Cu wiring 32.

After performing the above processes, it becomes possible to form the Cu-buried wiring 32 of a single layer buried in the low dielectric-constant insulation film 18 and the cap insulation film 20 which are film-made on the insulation film 14 and the etching-stopper layer 16 on the semiconductor substrate 12.

Figure 12A:
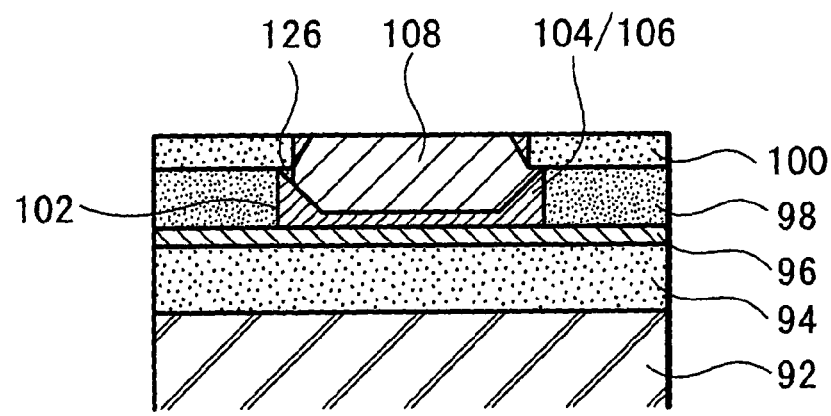
FIGS. 12A and 12B cross-sectional views explaining problems when a conventional separation-material for a photo-resist is used in case of forming a single layer buried wiring structure of a single damascene structure and in case of forming a multi-layer buried wiring structure of a dual damascene structure respectively.

The Cu-buried wiring 32 formed in this exemplified practical embodiment is performed with the medicinal liquid washing process of the exemplified practical embodiment 1, so that it is different from the Cu-buried wiring formed by a conventional single damascene method as shown in FIG. 12A such that the low dielectric-constant insulation film does not retreat and the photo-resist residuals and the polymer residuals are nearly completely removed.

In this way, the TaN film 26 and the Cu plated thin film 28 are film-made with an excellent coverage and there happens no problem such as a problem of the copper diffusing to the insulation film and a problem of a void production.

In this exemplified practical embodiment, the second invented method is explained taking an example of forming a wiring groove, but this exemplified practical embodiment can be applied when a contact hole is formed at an interlayer insulation film where a similar effect can be obtained.

A Modified Example of the Exemplified Practical Embodiment 1

This modified example is a modified example of the exemplified practical embodiment 1 and at the same time is one example of a practical embodiment according to the first invented method.

In this modified example, the cap insulation film 20 and the low dielectric-constant insulation film 18 are etching processed from the upper side of the photo-resist mask 22, the etching process is stopped at the surface of the etching-stopper layer 16, the wiring groove 24 is formed, and thereafter when the photo-resist mask 22 is removed, the photo-resist mask 22 is separated by a medicinal liquid washing process using the separation-material composition for the photo-resist of the exemplified practical embodiment 2 for 15 minutes instead of an ashing process. Subsequently, a pure water rinsing process and a drying process are performed according to an ordinary method.

The separation-material composition for the photo-resist used for the medicinal liquid washing process of this modified example is a separation-material composition for a photo-resist according to the exemplified practical embodiment 2 which is composed of 1.0 weight % of sulfamic acid, 18.8 weight % of $H_2O$, 0.2 weight % of ammonium 1-hydrogen difluoride, 20 weight % of N,N-dimethylacetamide, and 60 weight % of diethylene glycol mono-n-buthyl ether.

In this modified example, the medicinal liquid washing process using a separation-material composition for a photo-resist according to the exemplified practical embodiment 2 is performed and the wiring groove can be formed in such a manner that the photo-resist residuals and the polymer residuals do not remain as shown in FIG. 2C, moreover the performance of the low dielectric-constant film is not deteriorated as compared with a case of an ashing process, and at the same time the width of the wiring groove is not substantially widened.

An Exemplified Practical Embodiment 2 of a Manufacturing Method of a Semiconductor Device This exemplified practical embodiment is another example of a practical embodiment of a manufacturing method of a semiconductor device with reference to the second invented method, and FIGS. 4A to 4C, FIGS. 5D to 5F, FIGS. 6G to 6I, FIG. 7J and FIG. 7K are cross-sectional views of processes respectively when a dual damascene process is applied according to the method of this exemplified practical embodiment.

According to this exemplified practical embodiment, an upper layer wiring which will be connected to the Cu-buried wiring 32 formed according to the exemplified practical embodiment 1 is formed as a dual damascene structure.

Figure 4A:
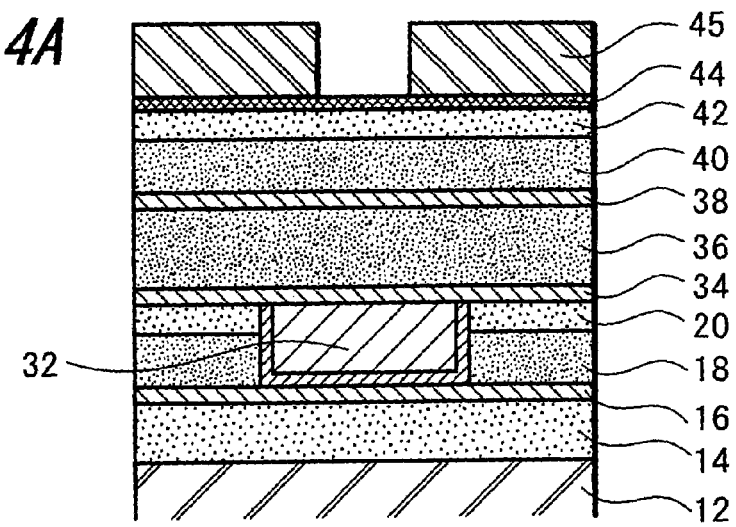
FIGS. 4A to 4C are cross-sectional views respectively showing each of processes when a dual damascene process is applied according to a method of an exemplified practical embodiment 2 or 8.

First, as shown in FIG. 4A, an etching-stopper layer 34, a low dielectric-constant insulation film 36, an etching-stopper layer 38, a low dielectric-constant insulation film 40, a cap insulation film 42 and a reflection prohibition film 44 are subsequently stacked in this order by, for example, a CVD method and the like.

Next, a photo-resist mask 45 having a predetermined contact hole pattern is formed on the reflection prohibition film 44.

Figure 4B:
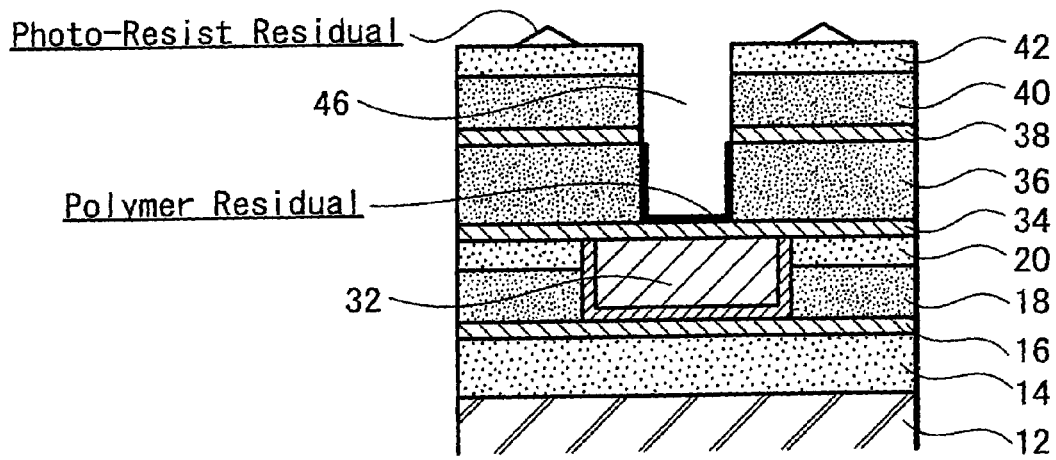

Subsequently, as shown in FIG. 4B, the reflection prohibition film 44, the cap insulation film 42, the low dielectric-constant insulation film 40, the etching-stopper layer 38 and the low dielectric-constant insulation film 36 are etching processed from the upper side of the photo-resist mask 45 such that a contact hole 46 is opened and this etching process is stopped at the surface of the etching-stopper layer 34.

Next, when the photo-resist mask is separated by the ashing process, photo-resist residuals remain on the cap insulation film 42 and polymer residuals are produced on the bottom wall of the contact hole 46 as shown in FIG. 4B.

Consequently, according to this exemplified practical embodiment, a medicinal liquid washing process which uses the separation-material composition for the photo-resist of the exemplified practical embodiment 1 is performed for 300 seconds at the insulation film stacking structure formed by the wiring groove pattern 24 so as to remove the photo-resist residuals and the polymer residuals, and subsequently a pure water rinsing process and a successive drying process are performed according to an ordinary method.

The separation-material composition for the photo-resist used for the medicinal liquid washing process is a separation-material composition for a photo-resist according to the exemplified practical embodiment 1 which is composed of 5.0 weight % of sulfamic acid, 34.7 weight % of $H_2O$, 0.3 weight % of ammonium 1-hydrogen difluoride, 30 weight % of N,N-dimethylacetamide, and 30 weight % of diethylene glycol mono-n-buthyl ether.

Figure 4C:
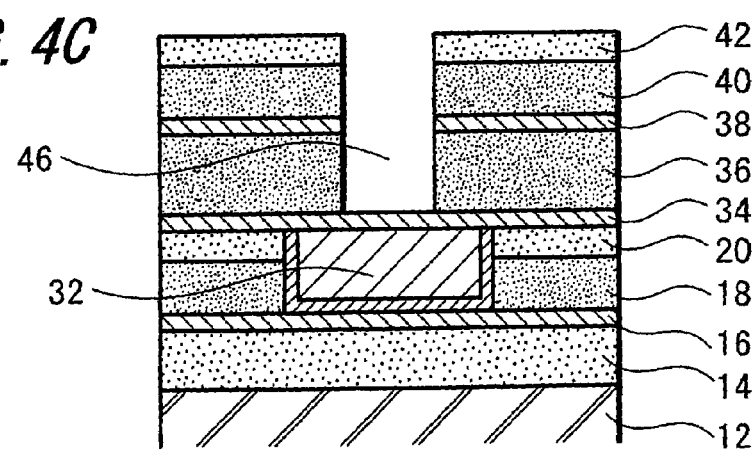

In this exemplified practical embodiment, the medicinal liquid washing process using a separation-material composition for a photo-resist according to the exemplified practical embodiment 1 is performed in such a manner that the photo-resist residuals are nearly completely removed from the top of the cap insulation film 42 and further the polymer residuals are also nearly completely removed from the contact hole 46 as shown in FIG. 4C.

Moreover, the performance of the low dielectric-constant film is not deteriorated as in a conventional case, and at the same time it does not happen that the diameter of the contact hole is increased.

Figure 5D:
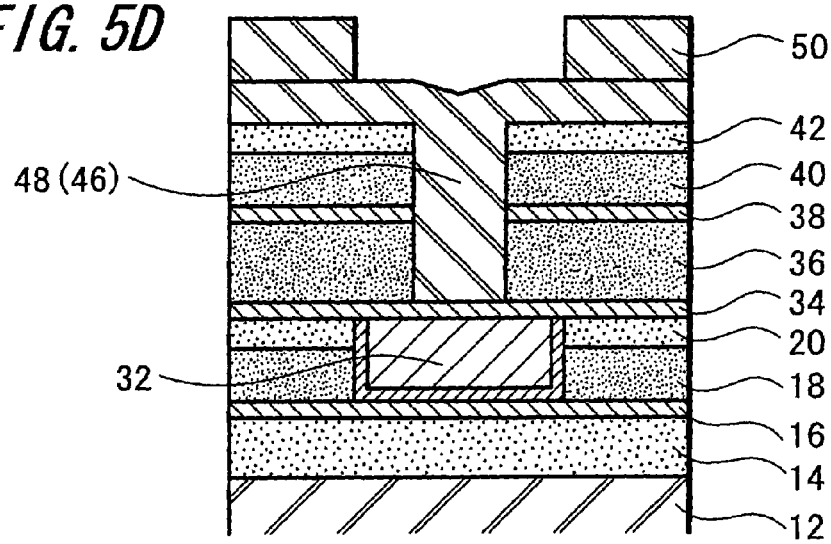
FIGS. 5D to 5F are cross-sectional views respectively showing each of processes when a dual damascene process is applied succeeding to FIG. 4C according to a method of an exemplified practical embodiment 2 or 8.
Figure 5E:
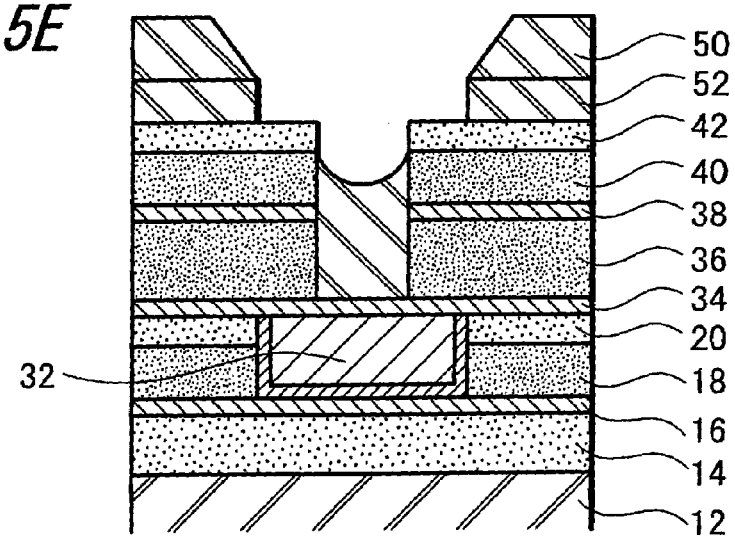

Next, as shown in FIG. 5D, the contact hole 46 is buried by a photo-resist layer 48 so as not to be etched when the wiring groove is worked and at the same time a photo-resist mask 50 having a wiring groove pattern is formed on the photo-resist layer 48.

Subsequently, the photo-resist layer 48 is etching processed from the upper side of the photo-resist mask 50 and a photo-resist mask 52 having a wiring groove pattern is formed on the cap insulation film 42.

Figure 5F:
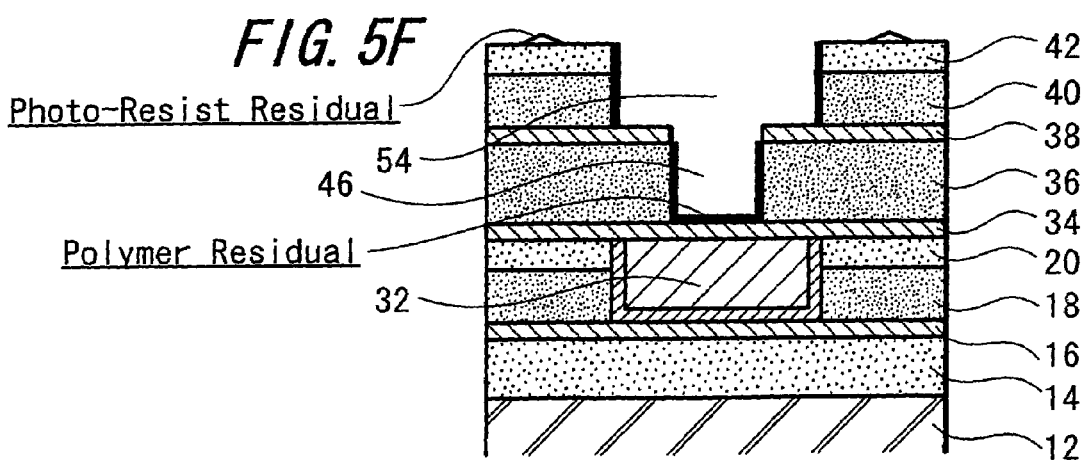

Additionally, as shown in FIG. 5F, the cap insulation film 42 and the low dielectric-constant insulation film 40 are etching processed from the upper side of the photo-resist mask 52 in a condition that this etching process is stopped at the surface of the etching-stopper layer 38 such that a wiring groove 54 is opened and further, the photo-resist layer 48 burying the contact hole 46 is removed and opened by an etching process and this etching process is stopped at the surface of the etching-stopper layer 34.

Next, when the photo-resist masks 50 and 52 are separated by an ashing process, photo-resist residuals remain on the surface of the cap insulation film 42 and polymer residuals are produced on the bottom wall and the side walls of the wiring groove 54.

Consequently, according to this exemplified practical embodiment, a medicinal liquid washing process which uses the separation-material composition for the photo-resist of the exemplified practical embodiment 1 is performed for 300 seconds at the insulation film stacking structure formed by the wiring groove 54 and the contact hole 46 so as to remove the photo-resist residuals and the polymer residuals, and subsequently a pure water rinsing process and a successive drying process are performed according to an ordinary method.

The separation-material composition for the photo-resist used for the medicinal liquid washing process is a separation-material composition for a photo-resist according to the exemplified practical embodiment 1 which is composed of 5.0 weight % of sulfamic acid, 34.7 weight % of $H_2O$, 0.3 weight % of ammonium 1-hydrogen difluoride, 30 weight % of N,N-dimethylacetamide, and 30 weight % of diethylene glycol mono-n-buthyl ether.

Figure 6G:
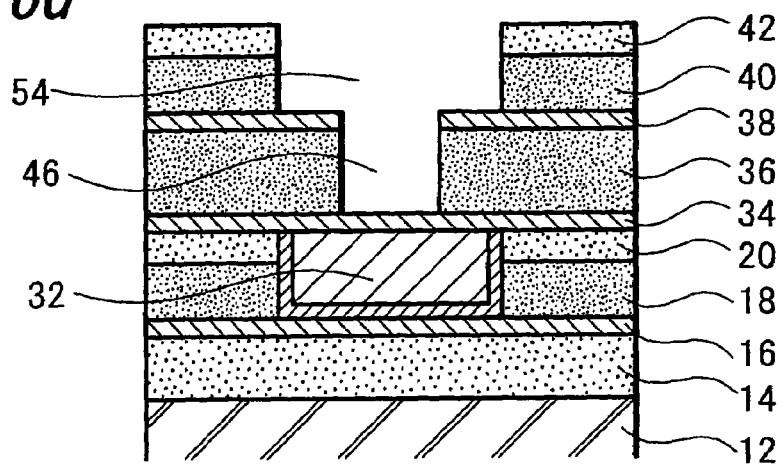
FIGS. 6G to 6I are cross-sectional views respectively showing each of processes when a dual damascene process is applied succeeding to FIG. 5F according to a method of an exemplified practical embodiment 2 or 8.

In this exemplified practical embodiment, the medicinal liquid washing process using a separation-material composition for a photo-resist according to the exemplified practical embodiment 1 is performed in such a manner that the photo-resist residuals are nearly completely removed from the top of the cap insulation film 42 and further the polymer residuals are also nearly completely removed from the bottom wall and the side walls of the contact hole 46 and the wiring groove 54 as shown in FIG. 6G.

Moreover, the performance of the low dielectric-constant film is not deteriorated as in a conventional case, and at the same time it does not happen that the diameter of the contact hole is increased.

Figure 6H:
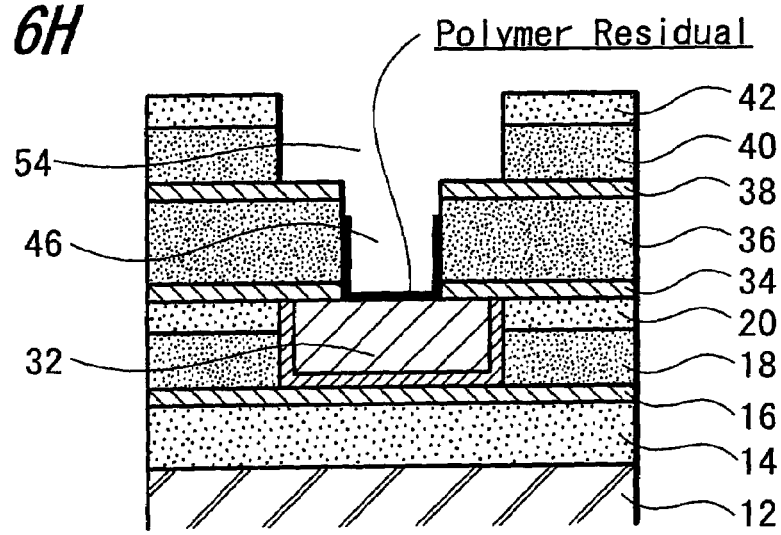

Further, as shown in FIG. 6H, the etching-stopper layer 34 is etching processed using the etching-stopper layer 38 as a mask and the contact hole 46 is made connected to the Cu-buried wiring 32 of the lower layer each other.

In this way, as shown in FIG. 6H, polymer residuals are produced at the bottom wall and the side walls of the contact hole 46.

Consequently, according to this exemplified practical embodiment, a medicinal liquid washing process which uses the separation-material composition for the photo-resist of the exemplified practical embodiment 1 is performed for 60 seconds so as to remove the polymer residuals, and subsequently a pure water rinsing process and a successive drying process are performed according to an ordinary method.

The separation-material composition for the photo-resist used for the medicinal liquid washing process is a separation-material composition for a photo-resist according to the exemplified practical embodiment 1 which is composed of 5.0 weight % of sulfamic acid, 34.7 weight % of $H_2O$, 0.3 weight % of ammonium 1-hydrogen difluoride, 30 weight % of N,N-dimethylacetamide, and 30 weight % of diethylene glycol mono-n-buthyl ether.

Figure 6I:
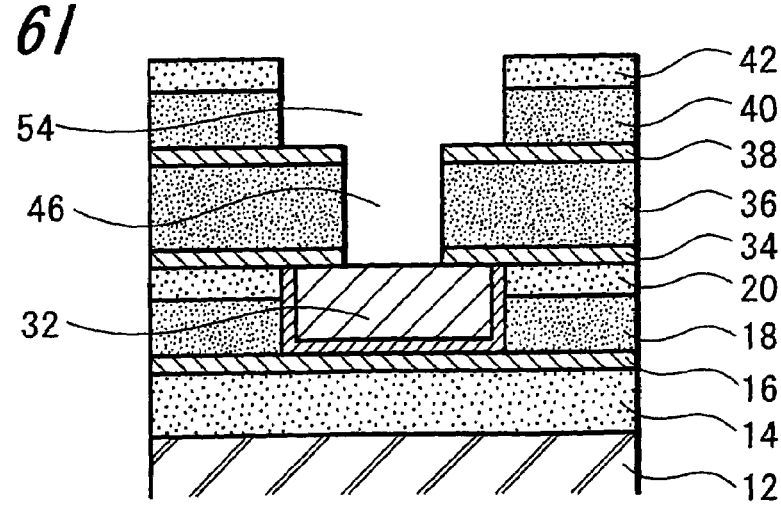

In this exemplified practical embodiment, the medicinal liquid washing process using a separation-material composition for a photo-resist according to the exemplified practical embodiment 1 is performed in such a manner that the polymer residuals are nearly completely removed from the bottom wall and the side walls of the contact hole 46 as shown in FIG. 6I.

Moreover, the performance of the low dielectric-constant film is not deteriorated as in a conventional case, and at the same time it does not happen that the diameter of the contact hole is increased.

Figure 7J:
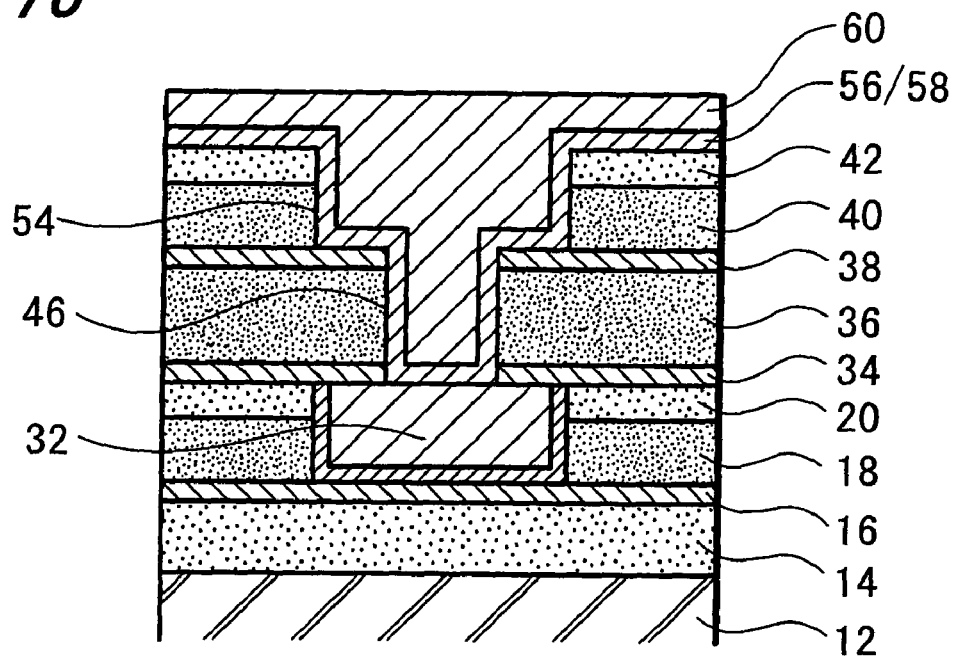
FIGS. 7J and 7K are cross-sectional views respectively showing each of processes when a dual damascene process is applied succeeding to FIG. 6I according to a method of an exemplified practical embodiment 2 or 8.

Next, as shown in FIG. 7J, a metal film 56 such as TaN and a Cu plated thin film 58 are film-made on the whole surface of the substrate by, for example, a sputtering method for the purpose of a wiring metal diffusion prohibition, and a conductive wiring layer 60 such as copper (Cu) is subsequently piled in the wiring groove 54 by, for example, a plating method so as to bury the wiring groove 54.

Figure 7K:
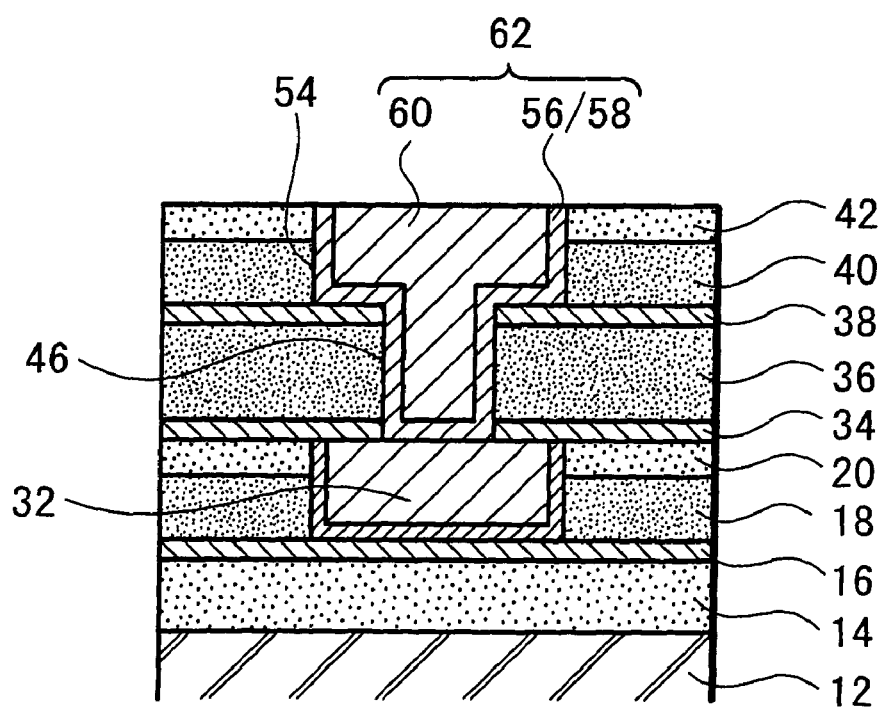

Next, as shown in FIG. 7K, the wiring layer 60 and the metal film 56/the Cu thin film 58 which were piled outside of the wiring groove 54 are removed by a CMP method and the like so as to form a Cu-buried wiring 62.

After performing the above processes, it becomes possible to form an upper layer wiring structure of a dual damascene structure connected to the Cu-buried wiring 32, that is, a Cu plug burying the contact hole 46 which is connected to the Cu-buried wiring 32 each other by passing through the etching-stopper layer 34, the low dielectric-constant insulation film 36 and the etching-stopper layer 38 and the Cu-buried wiring 62 burying the wiring groove 54 can be formed at the same time.

Figure 12B:
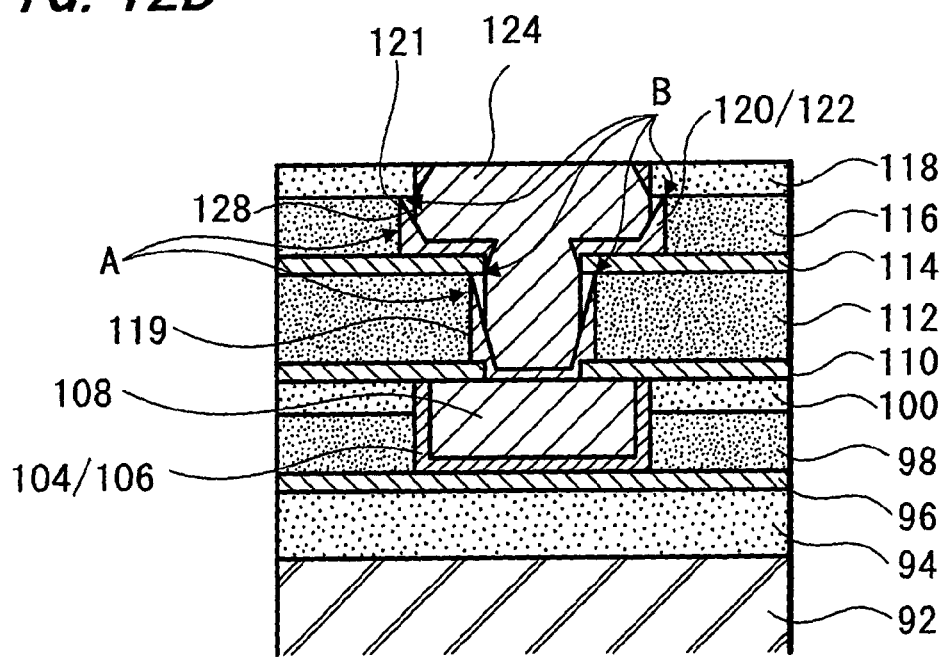

The Cu-buried wiring 62 of the dual damascene structure formed in this exemplified practical embodiment is performed with the medicinal liquid washing process using the separation-material composition for the photo-resist according to the exemplified practical embodiment 1, so that it is different from the Cu-buried wiring formed by a conventional dual damascene method as shown in FIG. 12B such that the low dielectric-constant insulation film does not retreat and moreover the photo-resist residuals and the polymer residuals are nearly completely removed.

In this way, the TaN film 56 and the Cu plated thin film 58 are film-made with an excellent coverage and there happens no problem such as a problem of the copper diffusing to the insulation film and a problem of a void production.

Additionally, it is possible to form a multi-layer wiring structure having a desired number of layers by applying a method of this exemplified practical embodiment in order to form a desired number of layers on the Cu-buried wiring 62.

A Modified Example 1 of the Exemplified Practical Embodiment 2

This modified example is a modified example of the exemplified practical embodiment 2 and at the same time is one example of a practical embodiment according to the first invented method.

In this modified example, as shown in FIG. 4B, the reflection prohibition film 44, the cap insulation film 42, the low dielectric-constant insulation film 40, the etching-stopper layer 38 and the low dielectric-constant insulation film 36 are etching processed from the upper side of the photo-resist mask 45, the etching process is stopped at the surface of the etching-stopper layer 34, the wiring groove 46 is formed, and thereafter when the photo-resist mask 45 is removed, the photo-resist mask 45 and reflection prohibition film 44 are separated by a medicinal liquid washing process using the separation-material composition for the photo-resist of the exemplified practical embodiment 2 for 15 minutes instead of an ashing process. Subsequently, a pure water rinsing process and a drying process are performed according to an ordinary method.

The separation-material composition for the photo-resist used for the medicinal liquid washing process is a photo-resist processing medicinal material according to the exemplified practical embodiment 2 which is composed of 1.0 weight % of sulfamic acid, 18.8 weight % of $H_2O$, 0.2 weight % of ammonium 1-hydrogen difluoride, 20 weight % of N,N-dimethylacetamide, and 60 weight % of diethylene glycol mono-n-buthyl ether.

In this modified example, the medicinal liquid washing process using a separation-material composition for a photo-resist according to the exemplified practical embodiment 2 is performed, so that the photo-resist residuals and the polymer residuals do not remain as shown in FIG. 4C and moreover the performance of the low dielectric-constant film is not deteriorated as compared with a case of an ashing process, and at the same time an opening shape where the diameter of the contact hole is not substantially increased can be formed.

A Modified Example 2 of the Exemplified Practical Embodiment 2

This modified example is a modified example of the exemplified practical embodiment 2 and at the same time is another example of a practical embodiment according to the first invented method.

In this modified example, as shown in FIG. 5F, the cap insulation film 42 and the low dielectric-constant insulation film 40 are etching processed from the upper side of the photo-resist mask 52, the etching process is stopped at the surface of the etching-stopper layer 38, the wiring groove 54 is formed, further the contact hole 46 is opened and thereafter when the photo-resist mask 52 is removed, the photo-resist mask 52 and the photo-resist mask 50 are separated by a medicinal liquid washing process using the separation-material composition for the photo-resist of the exemplified practical embodiment 2 for 15 minutes instead of an ashing process. Subsequently, a pure water rinsing process and a drying process are performed according to an ordinary method.

The separation-material composition for the photo-resist used for the medicinal liquid washing process is a separation-material composition for a photo-resist according to the exemplified practical embodiment 2 which is composed of 1.0 weight % of sulfamic acid, 18.8 weight % of $H_2O$, 0.2 weight % of ammonium 1-hydrogen difluoride, 20 weight % of N,N-dimethylacetamide, and 60 weight % of diethylene glycol mono-n-buthyl ether.

In this modified example, the medicinal liquid washing process using a separation-material composition for a photo-resist according to the exemplified practical embodiment 2 is performed, so that, as shown in FIG. 5F, the polymer residuals do not remain on the bottom wall and the side walls of the contact hole 46 and moreover the performance of the low dielectric-constant film is not deteriorated as compared with a case of an ashing process, and at the same time the contact hole 46 and the wiring groove 54 where the diameter of the contact hole and the width of the wiring groove are not substantially increased can be formed.

An Exemplified Practical Embodiment 3 of a Manufacturing Method of a Semiconductor Device This exemplified practical embodiment is still another example of a practical embodiment of a manufacturing method of a semiconductor device with reference to the second invented method, and FIGS. 8A to 8D are cross-sectional views of processes respectively when a wiring structure of a single layer is formed according to this exemplified practical embodiment.

Figure 8A:
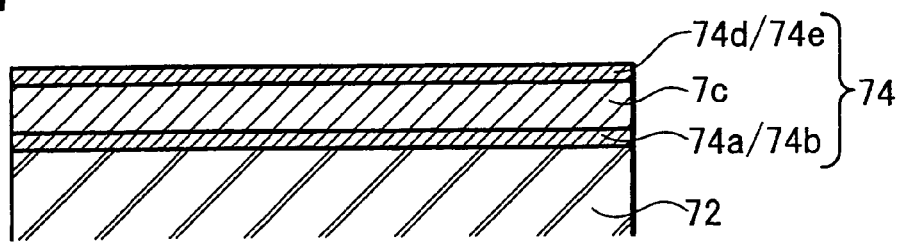
FIGS. 8A to 8D are cross-sectional views respectively showing each of processes for forming a wiring structure of a single layer according to a method of an exemplified practical embodiment 3 or 9.

This exemplified practical embodiment is an example of forming a wiring structure of a single layer on the base substrate and first, as shown in FIG. 8A, a first wiring 74 which is constituted by a Ti film 74a of a film thickness 20 nm, a TiN film 74b of a film thickness 20 nm, an Al-0.5% Cu film 74c of a film thickness 500 nm, a Ti film 74d of a film thickness 5 nm and a TiN film 74e of a film thickness 100 nm is formed by a magnetron sputtering method on the base substrate 72 on which devices such as transistors (not shown) are preliminarily formed under a film-making condition, for example, as shown below.

(Film-Making Condition of TI Film)
 PRESSURE: 0.52 Pam
 RF OUTPUT: 2 kW
 GAS FLOW RATE: Ar/35 sccm
 GROUTH TEMPERATURE: 300° C.

(Film-Making Condition of TiN Film)
 PRESSURE: 0.78 Pa
 RF OUTPUT: 6 kW
 GAS FLOW RATE: $N_2$/Ar=42/21 sccm
 GROUTH TEMPERATURE: 300° C.

(Film-Making Condition of Al-0.5% Cu Film)
 PRESSURE: 0.52 Pa
 RF OUTPUT: 15 kW
 GAS FLOW RATE: Ar/65 sccm
 GROUTH TEMPERATURE: 300° C.

Figure 8B:
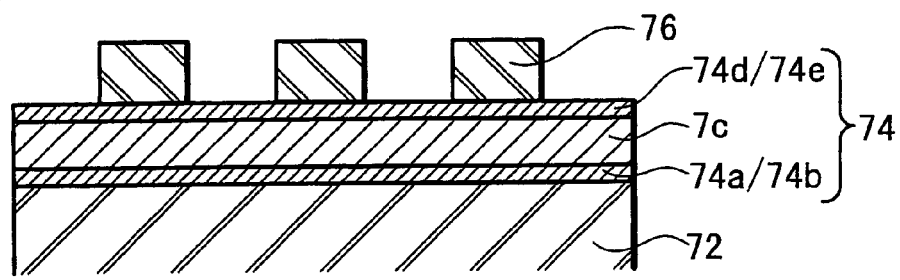

Next, a photo-resist mask 76 having a wiring pattern is formed on the TiN film 74e by a photolithography technique as shown in FIG. 8B in order to work the first wiring 74 using a dry-etching method.

Figure 8C:
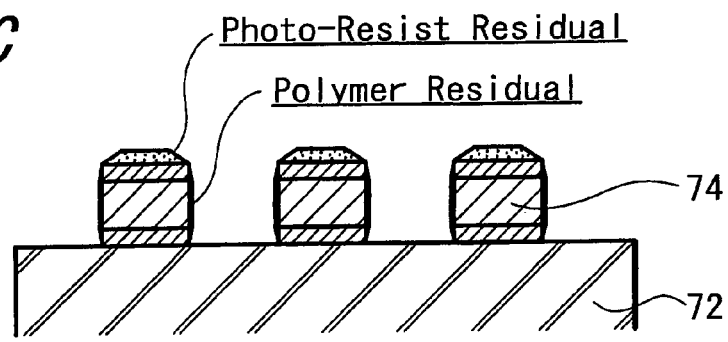

Subsequently, the first wiring 74 is etching worked under the following etching condition using a dry-etching method as shown in FIG. 8C:

(Dry-Etching Condition)
 GAS FLOW RATE: $BCl_3/Cl_2$=100/150 sccm
 PRESSURE: 1 Pa
 MICROWAVE: 400 mA
 RF OUTPUT: 110 W
 OVER-ETCHING: JUST+40% OVER-ETCHING Owing to the etching process, as shown in FIG. 8C, residuals of the photo-resist mask 76 are produced on the first wiring 74 and by-product polymer is produced at the side walls of the first wiring 74, so that these are removed by an ashing process.

Subsequently, according to this exemplified practical embodiment and the photo-resist residuals remaining a little bit on the first wiring 74 and the polymer residuals adhered to the first wiring 74 are removed by the medicinal liquid washing process of 300 seconds using the separation-material composition for the photo-resist of the exemplified practical embodiment 3.

(Condition of Photo-Resist Ashing Process)
 DEVICE: PARALLEL PLANE TYPE RIE DEVICE
 GAS FLOW RATE: $O_2$/3250 sccm
 TEMPERATURE: 250° C.

PRESSURE: 150 Pa
OUTPUT: 900 W
TIME: 60 seconds

The separation-material composition for the photo-resist used for the medicinal liquid washing process is a separation-material composition for a photo-resist according to the exemplified practical embodiment 3 which is composed of 2.5 weight % of sulfamic acid, 36.5 weight % of $H_2O$, 1.0 weight % of ammonium 1-hydrogen difluoride, 30 weight % of N,N-dimethylacetamide, and 30 weight % of diethylene glycol mono-n-buthyl ether.

Figure 8D:
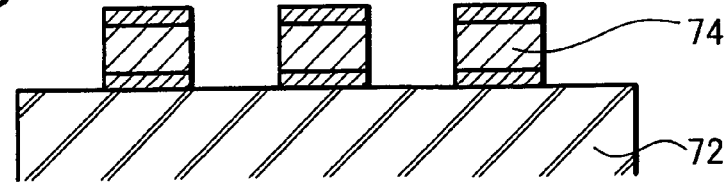

By performing the medicinal liquid washing process using the separation-material composition for the photo-resist according to the exemplified practical embodiment 3, as shown in FIG. 8D, the photo-resist residuals on the first wiring 74 and the polymer residuals on the side walls of the first wiring 74 can be removed nearly completely.

In this way, the first wiring 74 of a single layer wiring structure can be formed on the substrate 72. It should be noted that the wiring structure applied with the second invented method is not limited by the example of this exemplified practical embodiment.

An Exemplified Practical Embodiment 4 of a Manufacturing Method of a Semiconductor Device This exemplified practical embodiment is still another example of a practical embodiment of a manufacturing method of a semiconductor device with reference to the second invented method, and FIGS. 9E to 9G, FIG. 10H and FIG. 10I are cross-sectional views of processes respectively when a wiring structure of a 2-layer structure is formed succeeding to FIG. 8D of the exemplified practical embodiment 3.

Figure 9E:
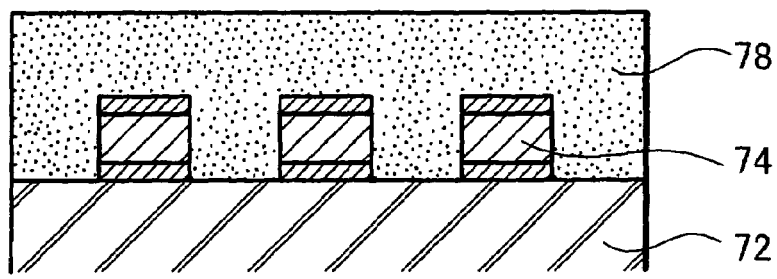
FIGS. 9E to 9G are cross-sectional views respectively showing each of processes when a wiring structure of a 2 layer structure is formed succeeding to FIG. 8D according to a method of an exemplified practical embodiment 4 or 10.
Figure 9F:
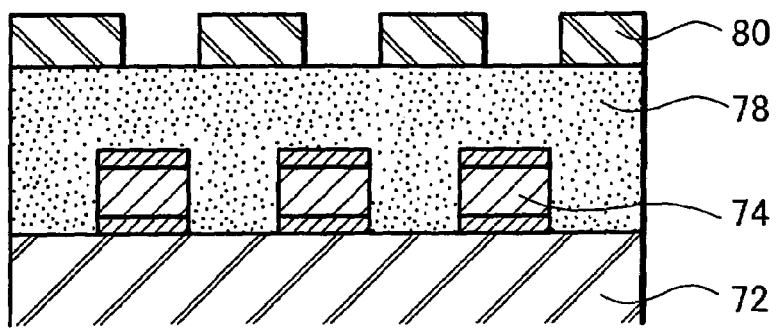
Figure 9G:
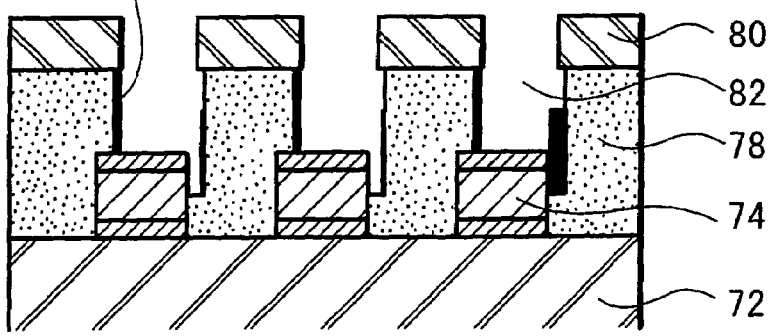

An $SiO_2$ film of 1400 nm thickness is film-made as an interlayer insulation film 78 on the substrate 72 on which the first wiring 74 of a single layer structure is formed in a film-making condition as follows:

(Film-Making Condition of Interlayer Insulation Film)
film-making method: HDP-$SiO_2$ CVD method
TEMPERATURE: 380° C.
OUTPUT: 3250 W
GAS FLOW RATE: $SiH_{4//O2}$/Ar=60/110/200 sccm
PRESSURE: 3 mTorr Subsequently, the interlayer insulation film 78 is polished to a 500 nm thickness and the surface thereof is made flat by a CMP method, and a photo-resist mask 80 having a hole pattern of a contact hole is formed by a photolithography technique on the interlayer insulation film 78 as shown in FIG. 9F.

Next, the interlayer insulation film 78 is etching processed from the upper side of the photo-resist mask 80 by using a dry-etching method in an etching condition below, so that a contact hole 82 is opened.

(Dry-Etching Condition)
GAS FLOW RATE: $C_4F_8$/Ar/CO/$O_2$=20/400/50/13 sccm
PRESSURE: 35 mTorr
RF OUTPUT: 2200 W
OVER-ETCHING: JUST+15% OVER-ETCHING Subsequently, the residuals of the photo-resist mask 78 are removed by an ashing process and further the polymer adhered to the side walls of the contact hole 82 is washed and removed by the medicinal liquid washing process of 300 seconds using the separation-material composition for the photo-resist of the exemplified practical embodiment 3, and further, a pure water rinsing process and a drying process are performed.

(Ashing Condition)
DEVICE: PARALLEL PLANE TYPE RIE DEVICE
GAS FLOW RATE: $O_2$/3250 sccm
TEMPERATURE: 250° C.
PRESSURE: 150 Pa
OUTPUT: 900 W
TIME: 60 seconds The separation-material composition for the photo-resist used for the medicinal liquid washing process is a separation-material composition for a photo-resist according to the exemplified practical embodiment 3 which is composed of 2.5 weight % of sulfamic acid, 36.5 weight % of $H_2O$, 1.0 weight % of ammonium 1-hydrogen difluoride, 30 weight % of N,N-dimethylacetamide, and 30 weight % of diethylene glycol mono-n-buthyl ether.

By performing the medicinal liquid washing process the photo-resist residuals and the polymer can be separated and removed nearly completely.

Figure 10H:
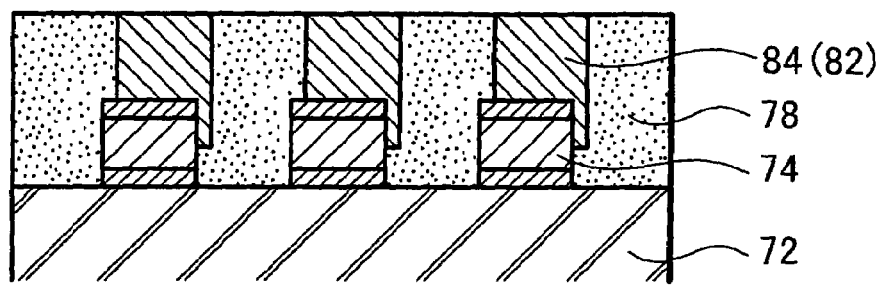
FIGS. 10H and 10I are cross-sectional views respectively showing each of processes when a wiring structure of a 2 layer structure is formed succeeding to FIG. 9G according to a method of an exemplified practical embodiment 4 or 10.

Next, a TiN film of a 30 nm thickness is film-made by, for example, a directional sputtering method and further, a W (tungsten) film of a 300 nm thickness is film-made to bury the contact hole 82, and subsequently, the W film is polished by a CMP process to form a W-plug 84 burying the contact hole 82 as shown in FIG. 10H.

Figure 10I:
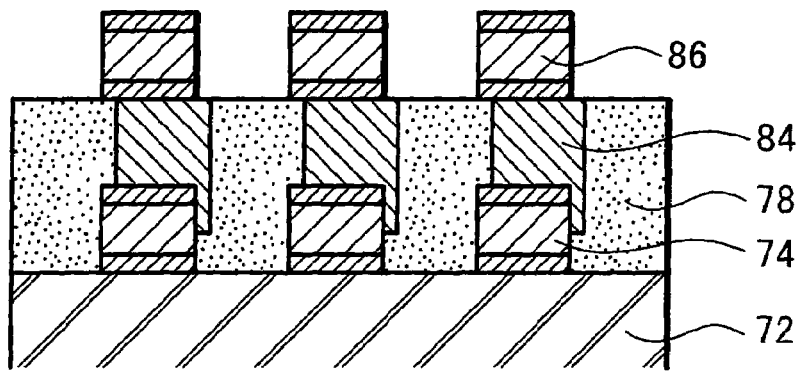
Figure 11A:
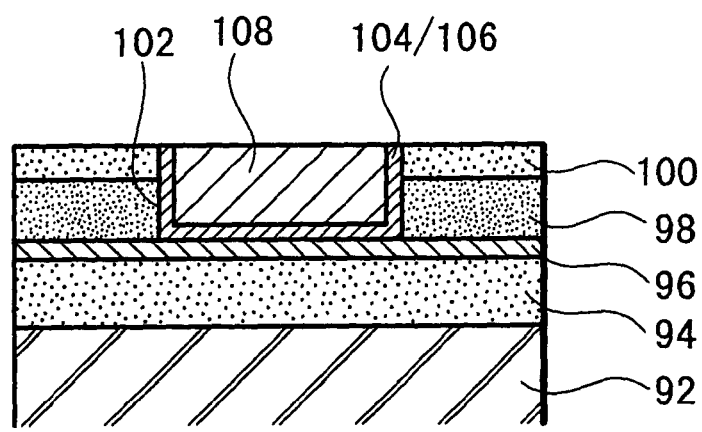
FIGS. 11A and 11B are constitutional cross-sectional views respectively showing a single layer buried wiring structure of a single damascene structure and a multi-layer buried wiring structure of a dual damascene structure.
Figure 11B:
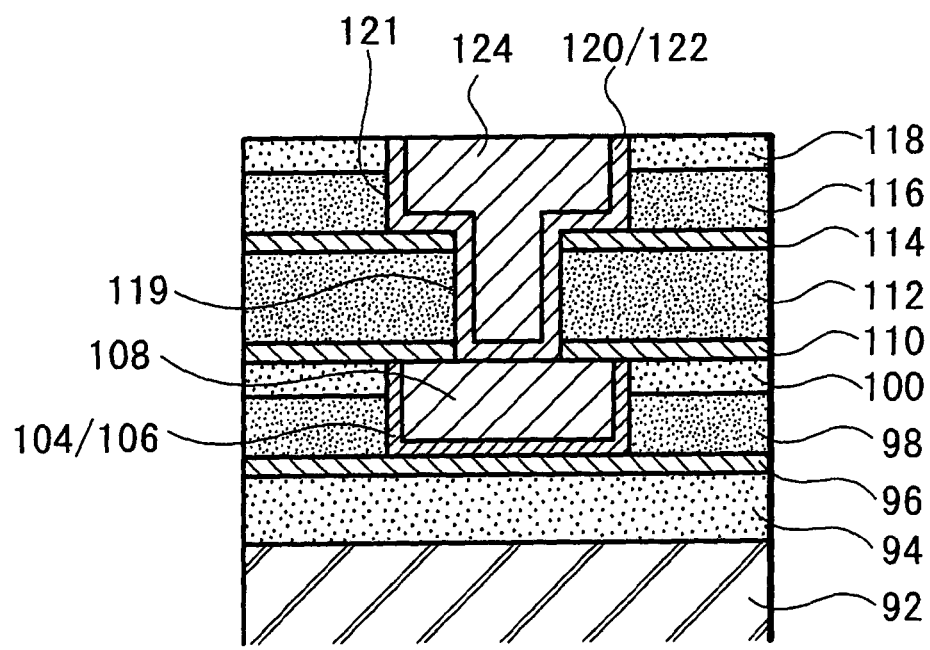

(Film-Making Condition of W Film) <Corresponding to 20 nm Thermal Oxide Film of Reverse-Sputtering>
TEMPERATURE: 400° C.
PRESSURE: 10.7 kPa
GAS FLOW RATE: $WF_6$/$H_2$/Ar=40/400/2250 sccm Further, similarly as the exemplified practical embodiment 3, a second wiring 86 connecting to the W-plug 84 is formed on the interlayer insulation film 78 such that a wiring structure of a 2-layer structure having the first wiring 74 and the second wiring 86 which is electrically connected to the first wiring 74 by means of the W-plug 84 can be formed as shown in FIG. 10I.

It should be noted that in this exemplified practical embodiment the interlayer insulation film 78 is not limited by the HDP-$SiO_2$ film. For example, the interlayer insulation film 78 can be made as a stacking structure of a low dielectric-constant insulation film and a silicon oxide film. As an example of the low dielectric-constant insulation film, a silicon oxide film added with fluorine, a silicon oxide film added with carbon and a film which is film-made by a material of hydrogen silsequioxane, methylsilsequioxane, polyacryl ether and Teflon (registered trademark) family can be used.

An Exemplified Practical Embodiment 5 of a Manufacturing Method of a Semiconductor Device This exemplified practical embodiment is one example of a practical embodiment of a manufacturing method of a semiconductor device with reference to the third invented method, and FIGS. 13A to 13C and FIGS. 14D to 14F are cross-sectional views of processes respectively when a single damascene process is carried out according to the method of this exemplified practical embodiment. It should be noted that the parts and/or portions of FIG. 13 and FIG. 14 corresponding to those of FIG. 2 to FIG. 3 are designated as the same reference numerals.

According to this exemplified practical embodiment, a Cu-buried wiring is formed by a single damascene process on a semiconductor substrate on which a semiconductor device such as a transistor (not shown) is formed in advance.

Figure 13A:
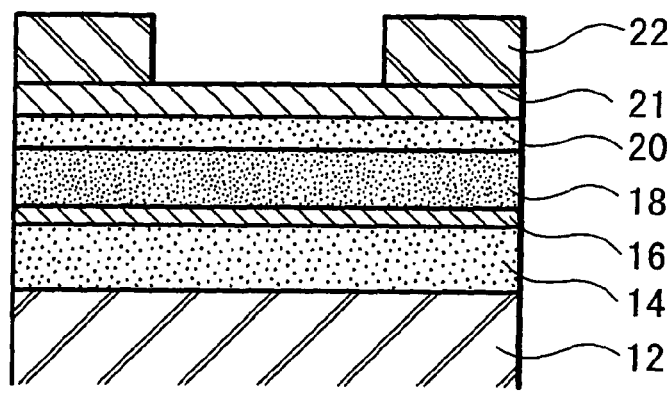
FIGS. 13A to 13C are cross-sectional views respectively showing each of processes when a single damascene process is applied according to a method of an exemplified practical embodiment 5 or 11.

First, as shown in FIG. 13A, an etching-stopper layer 16 is film-made by piling silicon nitride (SiN) using a reduced pressure CVD method and the like on an insulation film 14 which is film-made on a semiconductor substrate 12, and a low dielectric-constant (low-k) insulation film 18 and a cap insulation film 20 are successively piled on the etching-stopper layer 16 by means of a CVD method and the like.

Subsequently, in this exemplified practical embodiment, a silicon nitride film (SiN film) 21 forming a hard mask is piled by the same CVD method.

Next, a photo-resist mask 22 having a desired wiring groove pattern is formed.

Figure 13B:
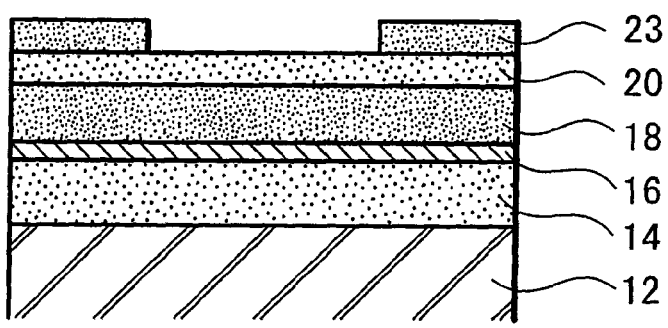

Next, as shown in FIG. 13B, a hard mask 23 which is transferred with a wiring groove pattern of a photo-resist mask 22 is patterning processed by etching the SiN film 21 from the upper side of the photo-resist mask 22. Subsequently, the photo-resist mask 22 is removed by an ashing process and the hard mask 23 is formed on the cap insulation film 20.

Figure 13C:
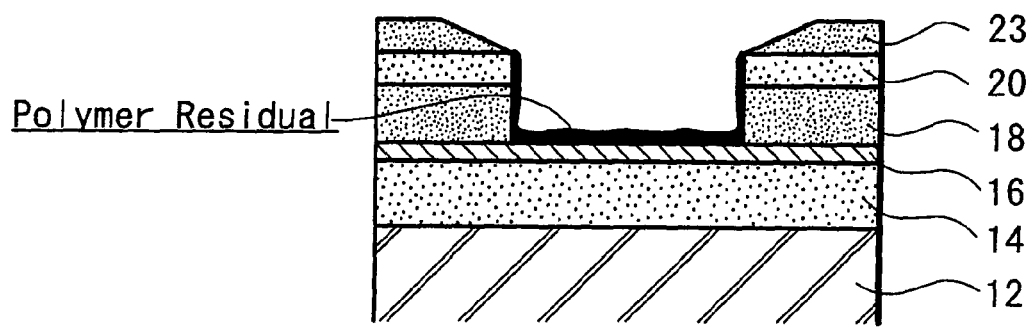

Subsequently, as shown in FIG. 13C, the cap insulation film 20 and the low dielectric-constant insulation film 18 are etching processed from the upper side of the hard mask 23, and this etching process is stopped at the surface of the etching-stopper layer 16 such that the wiring groove 24 is formed.

When this etching process is performed, polymer residuals are produced on the bottom wall and the side walls of the wiring groove 24 as shown in FIG. 13C.

Consequently, according to this exemplified practical embodiment, a medicinal liquid washing process which uses the separation-material composition for the photo-resist of the exemplified practical embodiment 1 is performed for 300 seconds at the insulation film stacking structure formed by the wiring groove pattern 24 so as to remove polymer residuals, and subsequently a pure water rinsing process and a successive drying process are performed according to an ordinary method.

The separation-material composition for the photo-resist used for the medicinal liquid washing process is a separation-material composition for a photo-resist according to the exemplified practical embodiment 1 which is composed of 5.0 weight % of sulfamic acid, 34.7 weight % of $H_2O$, 0.3 weight % of ammonium 1-hydrogen difluoride, 30 weight % of N,N-dimethylacetamide, and 30 weight % of diethylene glycol mono-n-buthyl ether.

Figure 14D:
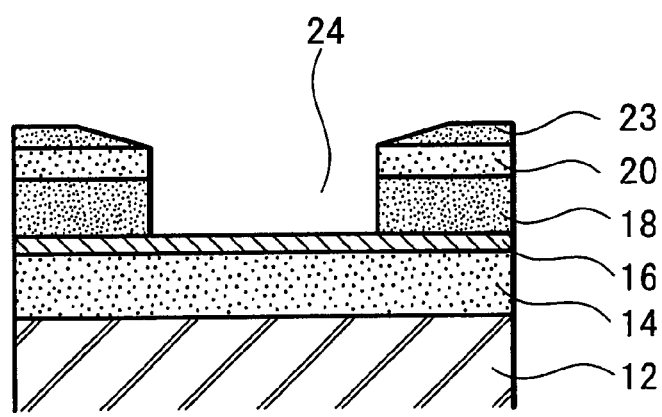
FIGS. 14D to 14F are cross-sectional views respectively showing each of processes when a single damascene process is applied succeeding to FIG. 2C according to the method of the exemplified practical embodiment 5 or 11.

In this exemplified practical embodiment, the medicinal liquid washing process is performed by using the separation-material composition for the photo-resist according to the exemplified practical embodiment 1, so that the polymer residuals are nearly completely removed from the wiring groove 24 as shown in FIG. 14D.

In this case it should be noted that it can be avoided from a phenomenon that the performance of the low dielectric-constant film is deteriorated and the width of the wiring groove is widened which will happen when a conventional separation-material composition for the photo-resist is used.

Figure 14E:
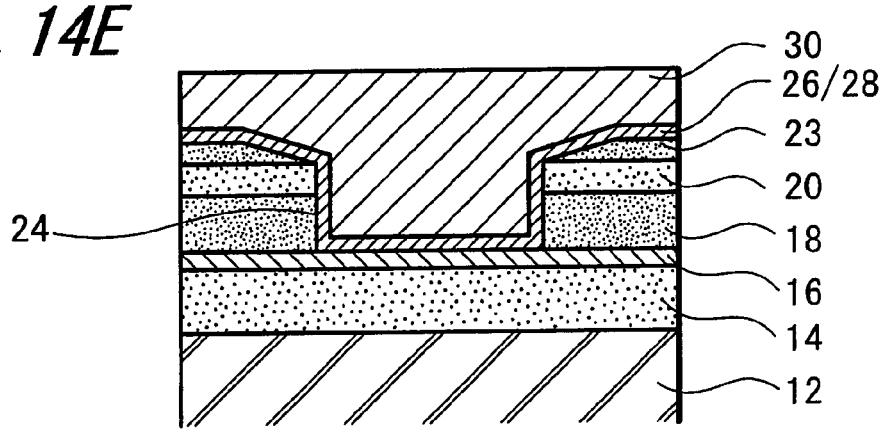

Next, as shown in FIG. 14E, a metal film 26 such as TaN and a Cu plated thin film 28 are film-made on the whole surface of the substrate by, for example, a sputtering method for the purpose of a wiring metal diffusion prohibition, and a conductive wiring layer 30 such as copper (Cu) is subsequently piled in the wiring groove 24 by, for example, a plating method so as to bury the wiring groove 24.

Figure 14F:
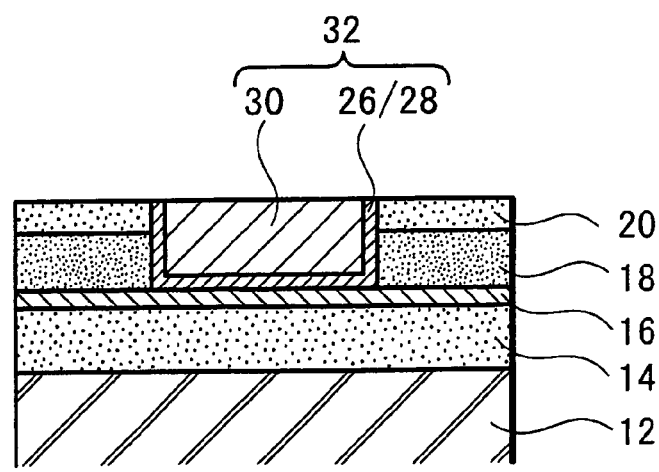

Next, as shown in FIG. 14F, the wiring layer 30, the metal film 26, the Cu thin film 28 and the SiN film 21 composing the hard mask 23 which were piled outside of the wiring groove 24 are removed by a CMP method and the like so as to form a Cu wiring 32.

After performing the above processes, it becomes possible to form the Cu-buried wiring 32 of a single layer buried in the low dielectric-constant insulation film 18 and the cap insulation film 20 which are film-made on the insulation film 14 and the etching-stopper layer 16 on the semiconductor substrate 12.

The Cu-buried wiring 32 formed in this exemplified practical embodiment is performed with the medicinal liquid washing process of the exemplified practical embodiment 1, so that it is different from the Cu-buried wiring formed by a conventional single damascene method as shown in FIG. 12C such that the low dielectric-constant insulation film does not retreat and the polymer residuals are nearly completely removed.

In this way, the TaN film 26 and the Cu plated thin film 28 are film-made with an excellent coverage and there happens no problem such as a problem of the copper diffusing to the insulation film and a problem of a void production.

In this exemplified practical embodiment, the method of the present invention is explained taking an example of forming a wiring groove, but this exemplified practical embodiment can be applied when a contact hole is formed at an interlayer insulation film where a similar effect can be obtained.

An Exemplified Practical Embodiment 6 of a Manufacturing Method of a Semiconductor Device This exemplified practical embodiment is another example of a practical embodiment of a manufacturing method of a semiconductor device with reference to the third invented method, and FIG. 15A, FIG. 15B, FIG. 16C, FIG. 16D, FIG. 17E, FIG. 17F, FIG. 18G, FIG. 18H, FIG. 19I and FIG. 19J are cross-sectional views of processes respectively when a dual damascene process is carried out according to the method of this exemplified practical embodiment. It should be noted that the parts and/or portions from FIG. 15 to FIG. 19 corresponding to those of FIG. 2 to FIG. 3 are designated as the same reference numerals.

According to this exemplified practical embodiment, an upper layer wiring of a dual damascene structure which is connected to a Cu-buried wiring formed in the exemplified practical embodiment 5 is formed.

Figure 15A:
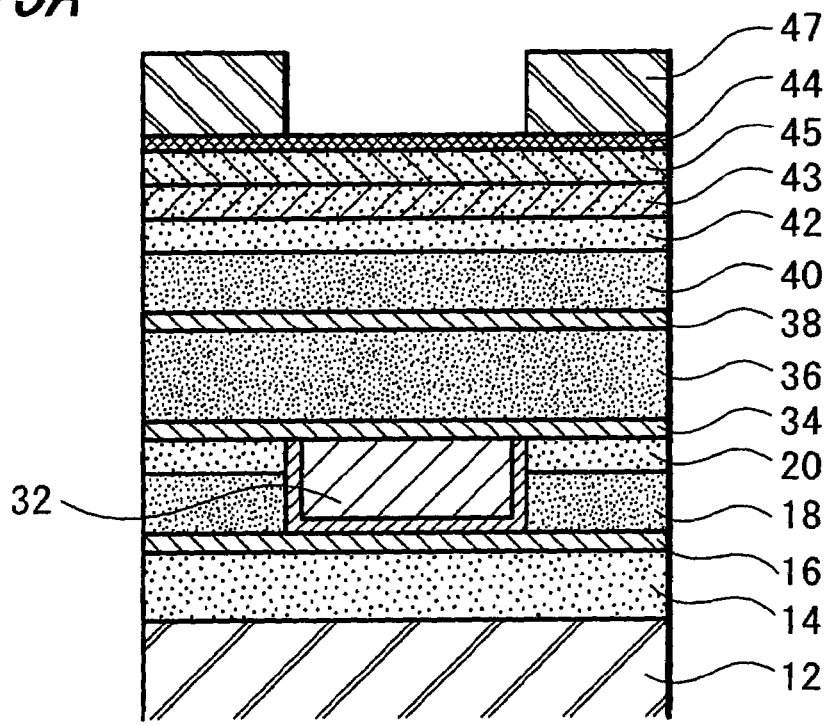
FIGS. 15A and 15B are cross-sectional views respectively showing each of processes when a dual damascene process is applied according to a method of an exemplified practical embodiment 6 or 12.

First, as shown in FIG. 15A, an etching-stopper layer 34, a low dielectric-constant insulation film 36, an etching-stopper layer 38, a low dielectric-constant insulation film 40 and a cap insulation film 42 are successively stacked on a Cu buried wiring 32 by means of a CVD method and the like.

Next, in this exemplified practical embodiment, a first mask $SiO_2$ film 43 forming a first hard mask, a second mask $SiO_2$ film 45 forming a second hard mask and a reflection prohibition film 44 are successively film-made on the cap insulation film 42.

Subsequently, a photo-resist mask 47 having a predetermined wiring groove pattern is film-made on the reflection prohibition film 44.

Figure 15B:
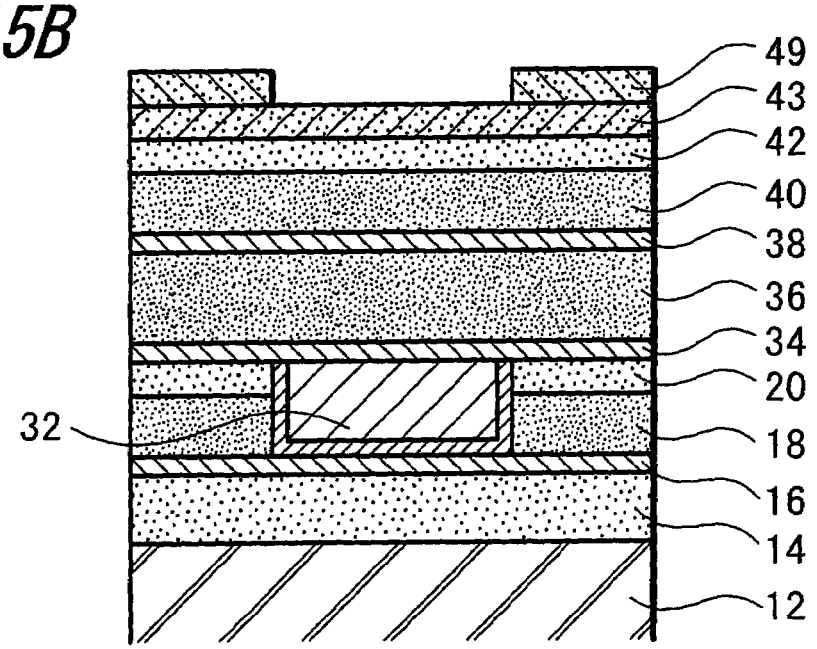

Next, as shown in FIG. 15B, a second hard mask 49 which is transferred with a wiring groove pattern of a photo-resist mask 47 is patterning processed by etching the reflection prohibition film 44 and the second mask $SiO_2$ film 45 from the upper side of the photo-resist mask 47. Subsequently, the photo-resist mask 47 is removed by an ashing process and the second hard mask 49 is formed on the first mask $SiO_2$ film 43.

Figure 16C:
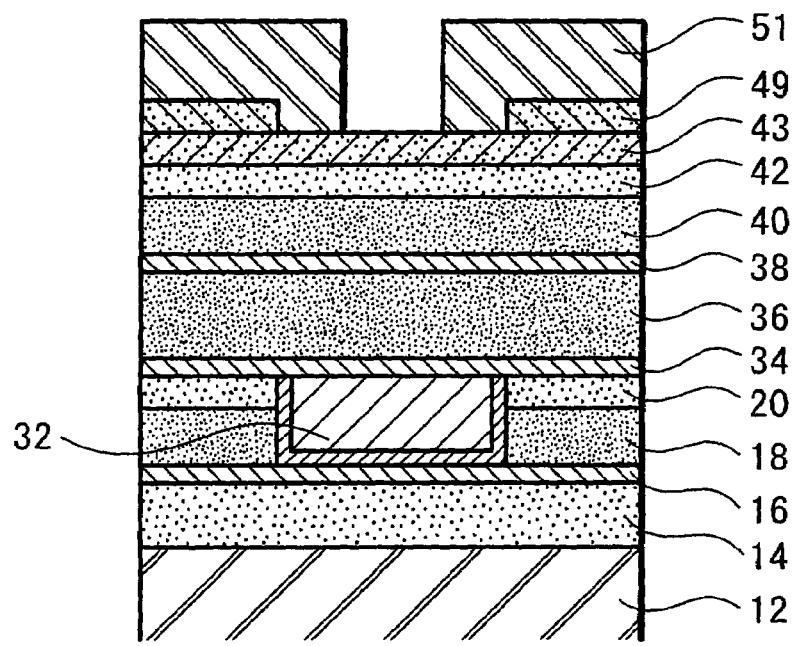
FIGS. 16C and 16D are cross-sectional views respectively showing each of processes when a dual damascene process is applied succeeding to FIG. 15B according to the method of the exemplified practical embodiment 6 or 12.

Subsequently, as shown in FIG. 16C, a photo-resist mask 51 having a contact hole pattern is formed on the first mask $SiO_2$ film 43 and the second mask 49.

Figure 16D:
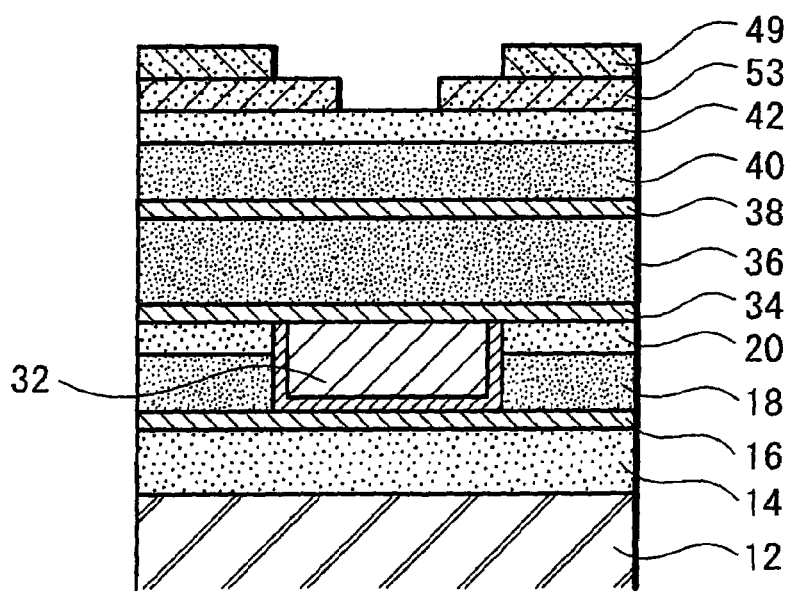

Next, a first mask 53 which is transferred with a contact hole pattern of a photo-resist mask 51 is patterning processed by etching the first mask $SiO_2$ film 43 from the upper side of the photo-resist mask 51 as shown in FIG. 16D. Subsequently, the photo-resist mask 51 is removed by an ashing process and the first hard mask 53 having a contact hole pattern is formed on the cap insulation film 42.

Figure 17E:
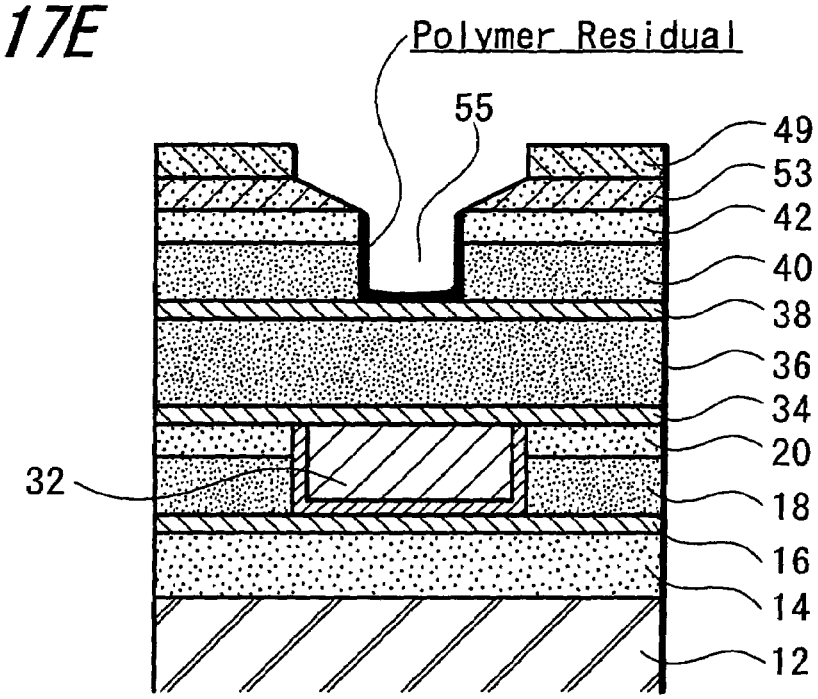
FIGS. 17E and 17F are cross-sectional views respectively showing each of processes when a dual damascene process is applied succeeding to FIG. 16D according to the method of the exemplified practical embodiment 6 or 12.

Subsequently, the cap insulation film 42 and the low dielectric-constant insulation film 40 are etching processed from the upper side of first hard mask 53 to which the contact hole pattern is transferred and this etching process is stopped at the surface of the etching-stopper layer 38 such that an aperture portion 55 having the contact hole pattern is formed as shown in FIG. 17E. When this etching process is performed, polymer residuals are produced on the bottom wall and the side walls of the aperture portion 55 as shown in FIG. 17E.

Figure 17F:
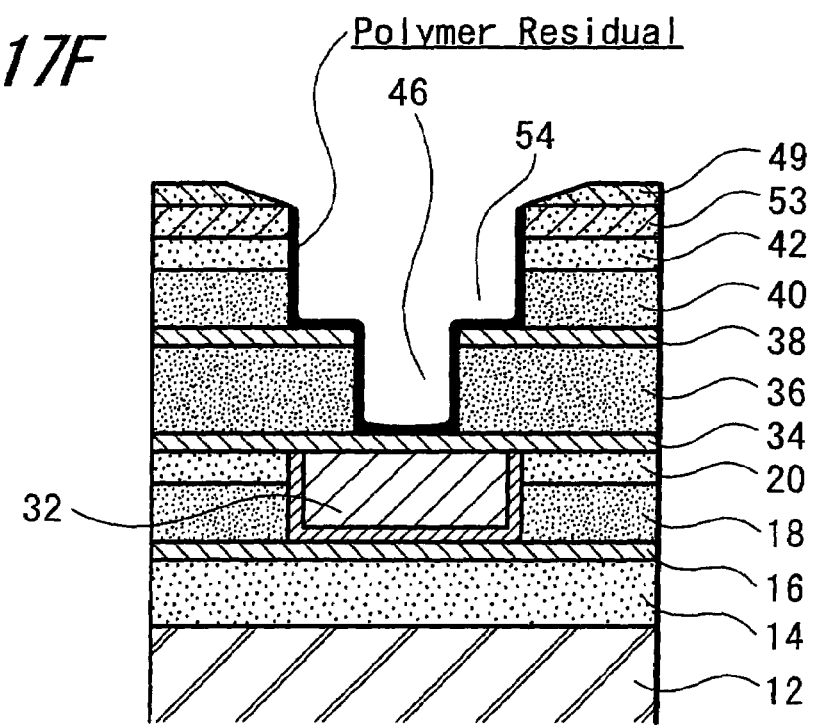

Subsequently, the first hard mask 53, the cap insulation film 42 and the low dielectric-constant insulation film 40 are etching processed from the upper side of the second hard mask 49 to which the wiring groove pattern is transferred and this etching process is stopped at the surface of the etching-stopper layer 38 such that the wiring groove 54 is formed as shown in FIG. 17F.

At the same time, the etching-stopper layer 38 at the bottom of the aperture portion 55 and the low dielectric-constant insulation film 36 are etching processed so as to open the contact hole 46 and this etching process is stopped at the surface of the etching-stopper layer 34.

Figure 18G:
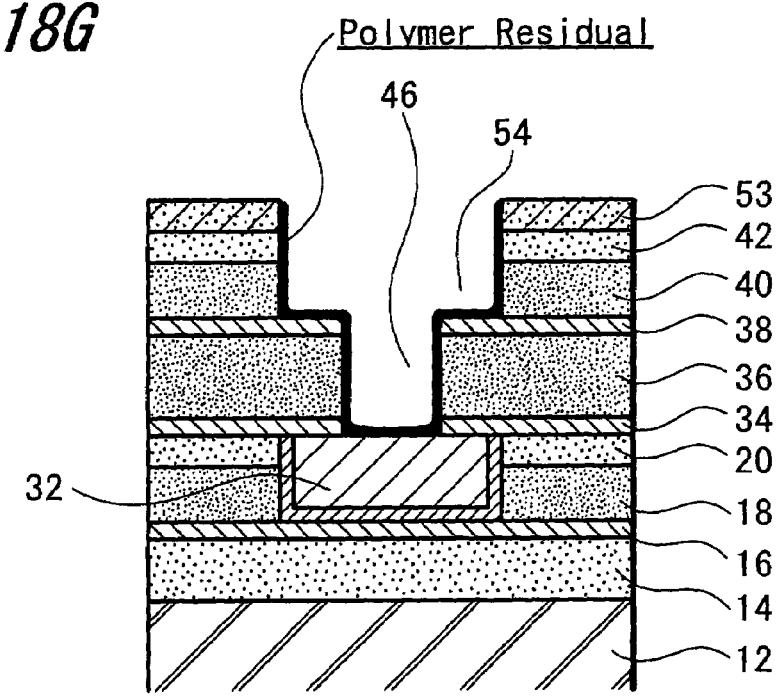
FIGS. 18G and 18H are cross-sectional views respectively showing each of processes when a dual damascene process is applied succeeding to FIG. 17F according to the method of the exemplified practical embodiment 6 or 12.

Next, the etching-stopper layer 34 is etching processed and the contact hole 46 is made connected to the Cu-buried wiring 32 of the lower layer each other as shown in FIG. 18G. In this stage, polymer residuals are adhered to the bottom wall and the side walls of the wiring groove 54 and to the bottom wall and the side walls of the contact hole 46.

Consequently, in a stage that the wiring groove 54 and the contact hole 46 are formed according to this exemplified practical embodiment, a medicinal liquid washing process which uses the separation-material composition for the photo-resist of the exemplified practical embodiment 1 is performed for 60 seconds so as to remove polymer residuals, and subsequently a pure water rinsing process and a successive drying process are performed according to an ordinary method.

The separation-material composition for the photo-resist used for the medicinal liquid washing process is a separation-material composition for a photo-resist according to the exemplified practical embodiment 1 which is composed of 5.0 weight % of sulfamic acid, 34.7 weight % of $H_2O$, 0.3 weight % of ammonium 1-hydrogen difluoride, 30 weight % of N,N-dimethylacetamide, and 30 weight % of diethylene glycol mono-n-buthyl ether.

Figure 18H:
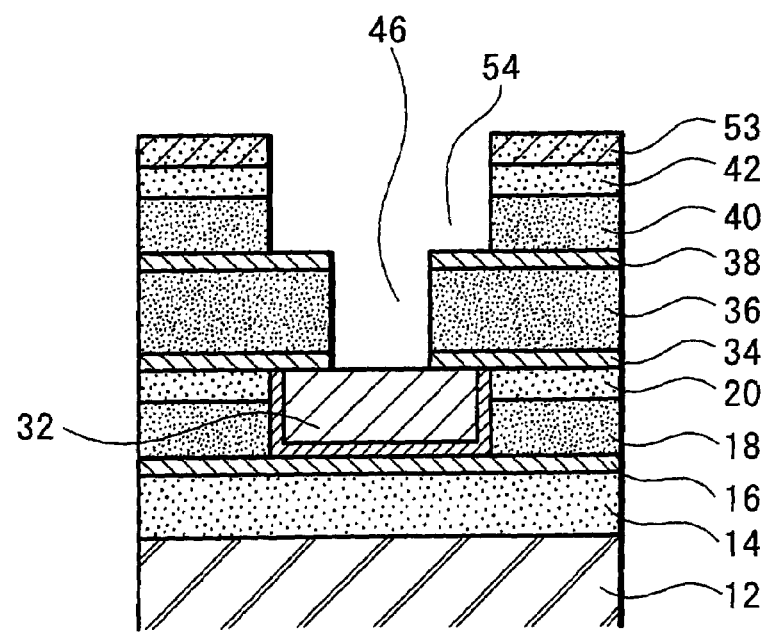

In this exemplified practical embodiment, the medicinal liquid washing process is performed by using the separation-material composition for the photo-resist according to the exemplified practical embodiment 1, so that the polymer residuals are nearly completely removed from the bottom wall and the side walls of the wiring groove 54 and from the bottom wall and the side walls of the contact hole 46 as shown in FIG. 18H.

In this case it should be noted that it can be avoided from a phenomenon that the performance of the low dielectric-constant film is deteriorated and the width of the wiring groove or the diameter of the contact hole is widened which will happen when a conventional separation-material composition for the photo-resist is used.

Figure 19I:
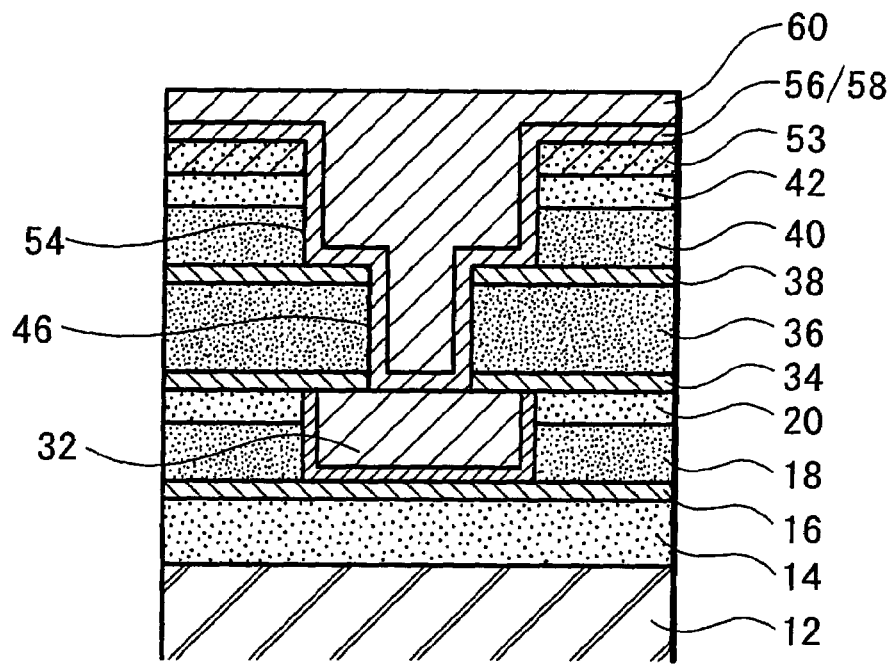
FIGS. 19I and 19J are cross-sectional views respectively showing each of processes when a dual damascene process is applied succeeding to FIG. 18H according to the method of the exemplified practical embodiment 6 or 12.

Next, as shown in FIG. 19I, a metal film 56 such as TaN and a Cu plated thin film 58 are film-made on the whole surface of the substrate by, for example, a sputtering method for the purpose of a wiring metal diffusion prohibition, and a conductive wiring layer 60 such as copper (Cu) is subsequently piled in the wiring groove 54 by, for example, a plating method so as to bury the wiring groove 54.

Figure 19J:
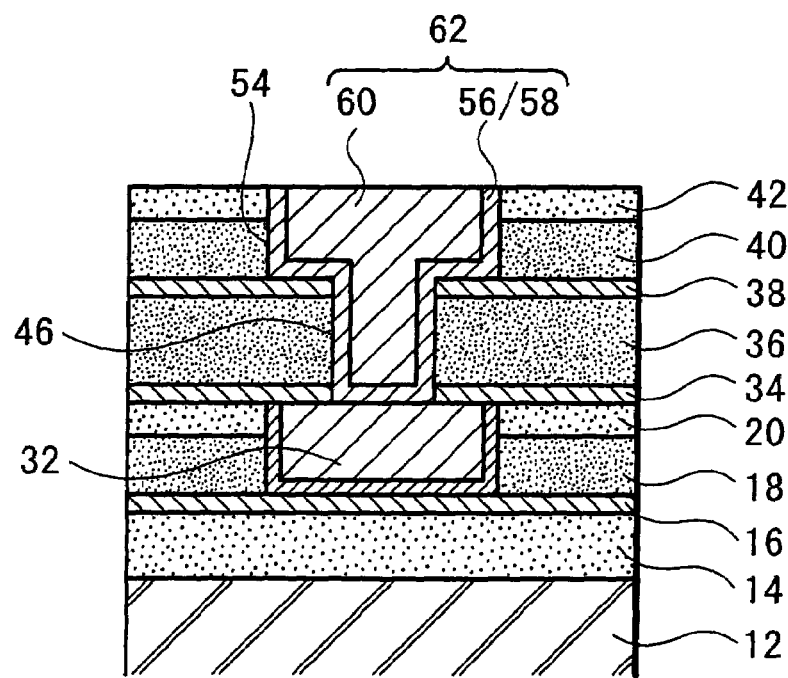

Next, as shown in FIG. 19J, the wiring layer 60, the metal film 56, the Cu thin film 58 and the hard mask 53 which were piled outside of the wiring groove 54 are removed by a CMP method and the like so as to form a Cu-buried wiring 62.

After performing the above processes, it becomes possible to form an upper layer wiring structure of a dual damascene structure connected to the Cu-buried wiring 32, that is, a Cu plug burying the contact hole 46 which is connected to the Cu-buried wiring 32 each other by passing through the etching-stopper layer 34, the low dielectric-constant insulation film 36 and the etching-stopper layer 38 and the Cu-buried wiring 62 burying the wiring groove 54 can be formed at the same time.

The Cu-buried wiring 62 of a dual damascene structure formed in this exemplified practical embodiment is performed with the medicinal liquid washing process of the exemplified practical embodiment 1, so that it is different from the Cu-buried wiring formed by a conventional dual damascene method as shown in FIG. 12B such that the low dielectric-constant insulation film does not retreat and the photo-resist residuals and the polymer residuals are nearly completely removed.

In this way, the TaN film 56 and the Cu plated thin film 58 are film-made with an excellent coverage and there happens no problem such as a problem of the copper diffusing to the insulation film and a problem of a void production.

Further, the evaluation of the separation-material composition for the photo-resist described with reference the separation-material composition for the photo-resist according to the exemplified practical embodiment 1 and shown in the table 1 is also true for the manufacturing method of a semiconductor device according to the exemplified practical embodiments 5 and 6. In more detail, by using the separation-material composition for the photo-resist according to the exemplified practical embodiment 1, it becomes possible to remove the photo-resist residuals and polymer residuals and at the same time to suppress the quality change and the retreat amount of the low dielectric-constant insulation film.

It is possible to form a multi-layer wiring structure having a desired number of layers by applying a method of the exemplified practical embodiment 6 in order to form more upper layer metal wirings until a desired number of layers on the Cu-buried wiring 62. Additionally, it is possible to form a multi-layer wiring structure by combining various exemplified practical embodiments such as stacking the wiring structures of the exemplified practical embodiments 1 and 5 according to the single damascene process, stacking the wiring structures of the exemplified practical embodiments 2 and 6 according to the dual damascene process and the like.

Further, in the exemplified practical embodiment 6, the polymer residuals are removed by a medicinal liquid process in the stage of FIG. 17F where the wiring groove 54 and the contact hole 46 are formed, but it is possible to remove the polymer residuals by a medicinal liquid process in the stage of FIG. 17E where the aperture portion 55 is opened or in the stage of FIG. 17F where the contact hole 46 and the wiring groove 54 are approximately formed.

A manufacturing method of a semiconductor device using a separation-material composition for a photo-resist in connection with the second invention will be explained hereinafter.

An Exemplified Practical Embodiment 7 of a Manufacturing Method of a Semiconductor Device This exemplified practical embodiment is still another example of a practical embodiment of a manufacturing method of a semiconductor device with reference to the fifth invented method, and it is carried out similarly as the manufacturing method of the semiconductor device according to the exemplified practical embodiment 1 except that a separation-material composition for a photo-resist of the exemplified practical embodiment 4 is used instead of the separation-material composition for the photo-resist of the exemplified practical embodiment 1. Therefore, the method of this exemplified practical embodiment will be explained by quoting the drawings of FIG. 2 and FIG. 3 in connection with the exemplified practical embodiment 1.

According to this exemplified practical embodiment, a Cu-buried wiring is formed by a single damascene process on a semiconductor substrate on which a semiconductor device such as a transistor (not shown) is formed in advance.

First, as shown in FIG. 2A, an etching-stopper layer 16 is film-made by piling silicon nitride (SiN) using a reduced pressure CVD method and the like on an insulation film 14 which is film-made on a semiconductor substrate 12, and a low dielectric-constant (low-k) insulation film 18 and a cap insulation film 20 are successively piled on the etching-stopper layer 16 by means of a CVD method and the like.

Next, a photo-resist mask 22 having a desired wiring groove pattern is formed.

Subsequently, as shown in FIG. 2B, the cap insulation film 20 and the low dielectric-constant insulation film 18 are etching processed from the upper side of the photo-resist mask 22 and this etching process is stopped at the surface of the etching-stopper layer 16 such that a wiring groove 24 is formed. An ashing process is subsequently performed so as to separate the photo-resist mask 22.

When the photo-resist mask 22 is separated by the ashing process, photo-resist residuals remain on the cap insulation film 20 and additionally, polymer residuals are produced in the wiring groove 24 as shown in FIG. 2B.

Consequently, according to this exemplified practical embodiment, a medicinal liquid washing process which uses the separation-material composition for the photo-resist of the exemplified practical embodiment 4 is performed for 300 seconds at the insulation film stacking structure formed by the wiring groove pattern 24 so as to remove the photo-resist residuals and the polymer residuals, and subsequently a pure water rinsing process and a successive drying process are performed according to a conventional method.

The separation-material composition for the photo-resist used for the medicinal liquid washing process is a separation-material composition for a photo-resist according to the exemplified practical embodiment 3 which is composed of 1-hydroxyethylidene-1, 3.0 weight % of 1-diphosphonic acid, 0.12 weight % of anmonium fluoride, 48.38 weight % of $H_2O$ and 48.5 weight % of diethylene glycol mono-n-buthl ether.

In this exemplified practical embodiment, the medicinal liquid washing process is performed by using the separation-material composition for the photo-resist according to the exemplified practical embodiment 4, so that the photo-resist residuals are nearly completely removed from the top of the cap insulation film 20 and further the polymer residuals are also nearly completely removed from the wiring groove 24 as shown in FIG. 2C.

In this case it should be noted that it can be avoided from a phenomenon that the performance of the low dielectric-constant film is deteriorated and the width of the wiring groove is widened which will happen when a conventional separation-material composition for the photo-resist is used.

Next, as shown in FIG. 3D, a metal film 26 such as TaN and a Cu plated thin film 28 are film-made on the whole surface of the substrate by, for example, a sputtering method for the purpose of a wiring metal diffusion prohibition, and a conductive wiring layer 30 such as copper (Cu) is subsequently piled in the wiring groove 24 by, for example, a plating method so as to bury the wiring groove 24.

Next, as shown in FIG. 3E, the wiring layer 30, the metal film 26 and the Cu thin film 28 which were piled outside of the wiring groove 24 are removed by a CMP method and the like so as to form a Cu wiring 32.

After performing the above processes, it becomes possible to form the Cu-buried wiring 32 of a single layer buried in the low dielectric-constant insulation film 18 and the cap insulation film 20 which are film-made on the insulation film 14 and the etching-stopper layer 16 on the semiconductor substrate 12.

The Cu-buried wiring 32 formed in this exemplified practical embodiment is performed with the medicinal liquid washing process of the exemplified practical embodiment 4, so that it is different from the Cu-buried wiring formed by a conventional single damascene method as shown in FIG. 12A such that the low dielectric-constant insulation film does not retreat and the photo-resist residuals and the polymer residuals are nearly completely removed.

In this way, the TaN film 26 and the Cu plated thin film 28 are film-made with an excellent coverage and there happens no problem such as a problem of the copper diffusing to the insulation film and a problem of a void production.

In this exemplified practical embodiment, the fifth invented method is explained taking an example of forming a wiring groove, but this exemplified practical embodiment can be applied when a contact hole is formed at an interlayer insulation film where a similar effect can be obtained.

A Modified Example 1 of the Exemplified Practical Embodiment 7

This modified example is a modified example of the exemplified practical embodiment 7 and at the same time is one example of a practical embodiment according to the fourth invented method.

In this modified example, the cap insulation film 20 and the low dielectric-constant insulation film 18 are etching processed from the upper side of the photo-resist mask 22, the etching process is stopped at the surface of the etching-stopper layer 16, the wiring groove 24 is formed, and thereafter when the photo-resist mask 22 is removed, the photo-resist mask 22 is separated by a medicinal liquid washing process using the separation-material composition for the photo-resist of the exemplified practical embodiment 5 for 15 minutes instead of an ashing process. Subsequently, a pure water rinsing process and a drying process are performed according to an ordinary method.

The separation-material composition for the photo-resist used for the medicinal liquid washing process is a separation-material composition for a photo-resist according to the exemplified practical embodiment 5 which is composed of 1-hydroxyethylidene-1, 12.0 weight % of 1-diphosphonic acid, 0.17 weight % of ammonium 1-hydrogen difluoride, 27.83 weight % of $H_2O$, 30.0 weight % of diethylene glycol mono-n-buthl ether and 30.0 weight % of N,N-dimethylacetamide.

In this modified example, the medicinal liquid washing process using a separation-material composition for a photo-resist according to the exemplified practical embodiment 2 is performed and the wiring groove 24 can be formed in such a manner that the photo-resist residuals and the polymer residuals do not remain as shown in FIG. 2C, moreover the performance of the low dielectric-constant film is not deteriorated as compared with a case of an ashing process, and at the same time the width of the wiring groove is not substantially widened. Therefore, it does not happen that the dielectric constant of the low dielectric-constant film changes as shown in FIG. 1A.

An Exemplified Practical Embodiment 8 of a Manufacturing Method of a Semiconductor Device This exemplified practical embodiment is another example of a practical embodiment of a manufacturing method of a semiconductor device with reference to the fifth invented method, and it is carried out similarly as the manufacturing method of the semiconductor device according to the exemplified practical embodiment 2 except that a separation-material composition for a photo-resist of the exemplified practical embodiment 4 is used instead of the separation-material composition for the photo-resist of the exemplified practical embodiment 1. Therefore, the method of this exemplified practical embodiment will be explained by quoting the drawings of FIGS. 4, 5, 6 and 7 which relate to the exemplified practical embodiment 2.

According to this exemplified practical embodiment, an upper layer wiring of a dual damascene structure is formed so as to be connected to the Cu-buried wiring 32 manufactured in the exemplified practical embodiment 7.

First, as shown in FIG. 4A, an etching-stopper layer 34, a low dielectric-constant insulation film 36, an etching-stopper layer 38, a low dielectric-constant insulation film 40, a cap insulation film 42 and a reflection prohibition film 44 are subsequently stacked in this order by, for example, a CVD method and the like.

Next, a photo-resist mask 45 having a predetermined contact hole pattern is formed on the reflection prohibition film 44.

Subsequently, as shown in FIG. 4B, the reflection prohibition film 44, the cap insulation film 42, the low dielectric-constant insulation film 40, the etching-stopper layer 38 and the low dielectric-constant insulation film 36 are etching processed from the upper side of the photo-resist mask 45 such that a contact hole 46 is opened and this etching process is stopped at the surface of the etching-stopper layer 34.

Next, when the photo-resist mask is separated by the ashing process, photo-resist residuals remain on the cap insulation film 42 and polymer residuals are produced on the bottom wall of the contact hole 46 as shown in FIG. 4B.

Consequently, according to this exemplified practical embodiment, a medicinal liquid washing process which uses the separation-material composition for the photo-resist of the exemplified practical embodiment 4 is performed for 300 seconds at the insulation film stacking structure formed by the wiring groove pattern 24 so as to remove the photo-resist residuals and the polymer residuals, and subsequently a pure water rinsing process and a successive drying process are performed according to an ordinary method.

The separation-material composition for the photo-resist used for the medicinal liquid washing process is a separation-material composition for a photo-resist according to the exemplified practical embodiment 4 which is composed of 1-hydroxyethylidene-1, 3.0 weight % of 1-diphosphonic acid, 0.12 weight % of anmonium fluoride, 48.38 weight % of $H_2O$ and 48.5 weight % of diethylene glycol mono-n-buthl ether.

In this exemplified practical embodiment, the medicinal liquid washing process using a separation-material composition for a photo-resist according to the exemplified practical embodiment 4 is performed in such a manner that the photo-resist residuals are nearly completely removed from the top of the cap insulation film 42 and further the polymer residuals are also nearly completely removed from the contact hole 46 as shown in FIG. 4C.

Moreover, the performance of the low dielectric-constant film is not deteriorated as in a conventional case, and at the same time it does not happen that the diameter of the contact hole is increased.

Next, as shown in FIG. 5D, the contact hole 46 is buried by a photo-resist layer 48 so as not to be etched when the wiring groove is worked and at the same time a photo-resist mask 50 having a wiring groove pattern is formed on the photo-resist layer 48.

Subsequently, the photo-resist layer 48 is etching processed from the upper side of the photo-resist mask 50 and a photo-resist mask 52 having a wiring groove pattern is formed on the cap insulation film 42.

Additionally, as shown in FIG. 5F, the cap insulation film 42 and the low dielectric-constant insulation film 40 are etching processed from the upper side of the photo-resist mask 52 in a condition that this etching process is stopped at the surface of the etching-stopper layer 38 such that a wiring groove 54 is opened and further, the photo-resist layer 48 burying the connecting aperture 46 is removed and opened by an etching process and this etching process is stopped at the surface of the etching-stopper layer 34.

Next, when the photo-resist masks 50 and 52 are separated by an ashing process, photo-resist residuals remain on the surface of the cap insulation film 42 and polymer residuals are produced on the bottom wall and the side walls of the wiring groove 54.

Consequently, according to this exemplified practical embodiment, a medicinal liquid washing process which uses the separation-material composition for the photo-resist of the exemplified practical embodiment 4 is performed for 300 seconds at the insulation film stacking structure formed by the wiring groove 54 and the contact hole 46 so as to remove the photo-resist residuals and the polymer residuals, and subsequently a pure water rinsing process and a successive drying process are performed according to an ordinary method.

The separation-material composition for the photo-resist used for the medicinal liquid washing process is a separation-material composition for a photo-resist according to the exemplified practical embodiment 4 which is composed of 1-hydroxyethylidene-1, 3.0 weight % of 1-diphosphonic acid, 0.12 weight % of anmonium fluoride, 48.38 weight % of $H_2O$ and 48.5 weight % of diethylene glycol mono-n-buthl ether.

In this exemplified practical embodiment, the medicinal liquid washing process using a separation-material composition for a photo-resist according to the exemplified practical embodiment 4 is performed in such a manner that the photo-resist residuals are nearly completely removed from the top of the cap insulation film 42 and further the polymer residuals are also nearly completely removed from the bottom wall and the side walls of the contact hole 46 and the wiring groove 54 as shown in FIG. 6G.

Moreover, the performance of the low dielectric-constant film is not deteriorated as in a conventional case, and at the same time it does not happen that the diameter of the contact hole is increased.

Further, as shown in FIG. 6H, the etching-stopper layer 34 is etching processed using the etching-stopper layer 38 as a mask and the contact hole 46 is made connected to the Cu-buried wiring 32 of the lower layer each other.

In this way, as shown in FIG. 6H, polymer residuals are produced at the bottom wall and the side walls of the contact hole 46.

Consequently, according to this exemplified practical embodiment, a medicinal liquid washing process which uses the separation-material composition for the photo-resist of the exemplified practical embodiment 4 is performed for 60 seconds so as to remove the polymer residuals, and subsequently a pure water rinsing process and a successive drying process are performed according to an ordinary method.

The separation-material composition for the photo-resist used for the medicinal liquid washing process is a separation-material composition for a photo-resist according to the exemplified practical embodiment 4 which is composed of 1-hydroxyethylidene-1, 3.0 weight % of 1-diphosphonic acid, 0.12 weight % of anmonium fluoride, 48.38 weight % of H$_2$O and 48.5 weight % of diethylene glycol mono-n-buthl ether.

In this exemplified practical embodiment, the medicinal liquid washing process using a separation-material composition for a photo-resist according to the exemplified practical embodiment 4 is performed in such a manner that the polymer residuals are nearly completely removed from the bottom wall and the side walls of the contact hole 46 as shown in FIG. 6I.

Moreover, the performance of the low dielectric-constant film is not deteriorated as in a conventional case, and at the same time it does not happen that the diameter of the contact hole is increased.

Next, as shown in FIG. 7J, a metal film 56 such as TaN and a Cu plated thin film 58 are film-made on the whole surface of the substrate by, for example, a sputtering method for the purpose of a wiring metal diffusion prohibition, and a conductive wiring layer 60 such as copper (Cu) is subsequently piled in the wiring groove 54 by, for example, a plating method so as to bury the wiring groove 54.

Next, as shown in FIG. 7K, the wiring layer 60 and the metal film 56/the Cu thin film 58 which were piled outside of the wiring groove 54 are removed by a CMP method and the like so as to form a Cu-buried wiring 62.

After performing the above processes, it becomes possible to form an upper layer wiring structure of a dual damascene structure connected to the Cu-buried wiring 32, that is, a Cu plug burying the connecting aperture 46 which is connected to the Cu-buried wiring 32 each other by passing through the etching-stopper layer 34, the low dielectric-constant insulation film 36 and the etching-stopper layer 38 and the Cu-buried wiring 62 burying the wiring groove 54 can be formed at the same time.

Figure 1B:
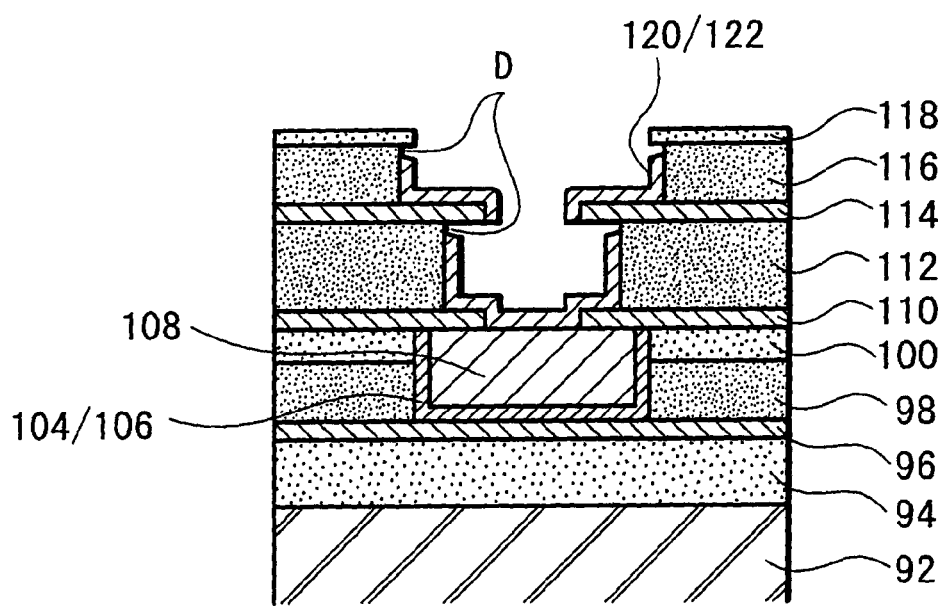

The Cu-buried wiring 62 of the dual damascene structure formed in this exemplified practical embodiment is performed with the medicinal liquid washing process using the separation-material composition for the photo-resist according to the exemplified practical embodiment 4, so that it is different from the Cu-buried wiring formed by a conventional dual damascene method as shown in FIG. 12B, FIG. 1A and FIG. 1B such that the low dielectric-constant insulation film does not retreat or does not become deteriorated and moreover the photo-resist residuals and the polymer residuals are nearly completely removed.

In this way, the TaN film 56 and the Cu plated thin film 58 are film-made with an excellent coverage and there happens no problem such as a problem of the copper diffusing to the insulation film and a problem of a void production.

Additionally, it is possible to form a multi-layer wiring structure having a desired number of layers by applying a method of this exemplified practical embodiment in order to form a desired number of layers on the Cu-buried wiring 62.

A Modified Example 1 of the Exemplified Practical Embodiment 8

This modified example is a modified example of the exemplified practical embodiment 8 and at the same time is one example of a practical embodiment according to the fourth invented method.

In this modified example, as shown in FIG. 4B, the reflection prohibition film 44, the cap insulation film 42, the low dielectric-constant insulation film 40, the etching-stopper layer 38 and the low dielectric-constant insulation film 36 are etching processed from the upper side of the photo-resist mask 45, the etching process is stopped at the surface of the etching-stopper layer 34, the wiring groove 46 is formed, and thereafter when the photo-resist mask 45 is removed, the photo-resist mask 45 and the reflection prohibition film 44 are separated by a medicinal liquid washing process using the separation-material composition for the photo-resist of the exemplified practical embodiment 2 for 15 minutes instead of an ashing process. Subsequently, a pure water rinsing process and a drying process are performed according to an ordinary method.

The separation-material composition for the photo-resist used for the medicinal liquid washing process is a separation-material composition for a photo-resist according to the exemplified practical embodiment 5 which is composed of 1-hydroxyethylidene-1, 12.0 weight % of 1-diphosphonic acid, 0.17 weight % of ammonium 1-hydrogen difluoride, 27.83 weight % of H$_2$O, 30.0 weight % of diethylene glycol mono-n-buthl ether and 30.0 weight % of N,N-dimethylacetamide.

In this modified example, the medicinal liquid washing process using a separation-material composition for a photo-resist according to the exemplified practical embodiment 2 is performed, so that the photo-resist residuals and the polymer residuals do not remain as shown in FIG. 4C and moreover the performance of the low dielectric-constant film is not deteriorated as compared with a case of an ashing process, and at the same time an opening shape where the diameter of the contact hole is not substantially increased can be formed.

A Modified Example 2 of the Exemplified Practical Embodiment 8

This modified example is a modified example of the exemplified practical embodiment 8 and at the same time is another example of a practical embodiment according to the fourth invented method.

In this modified example, as shown in FIG. 5F, the cap insulation film 42 and the low dielectric-constant insulation film 40 are etching processed from the upper side of the photo-resist mask 52, the etching process is stopped at the surface of the etching-stopper layer 38, the wiring groove 54 is formed, further the connecting aperture 46 is opened and thereafter when the photo-resist mask 52 is removed, the photo-resist mask 52 and the photo-resist mask 50 are separated by a medicinal liquid washing process using the separation-material composition for the photo-resist of the exemplified practical embodiment 2 for 15 minutes instead of an ashing process. Subsequently, a pure water rinsing process and a drying process are performed according to an ordinary method.

The separation-material composition for the photo-resist used for the medicinal liquid washing process is a separation-material composition for a photo-resist according to the exemplified practical embodiment 5 which is composed of 1-hydroxyethylidene-1, 12.0 weight % of 1-diphosphonic acid, 0.17 weight % of ammonium 1-hydrogen difluoride, 27.83 weight % of H$_2$O, 30.0 weight % of diethylene glycol mono-n-buthl ether and 30.0 weight % of N,N-dimethylacetamide.

In this modified example, the medicinal liquid washing process using a separation-material composition for a photo-resist according to the exemplified practical embodiment 5 is performed, so that, as shown in FIG. 5F, the polymer residuals do not remain on the bottom wall and the side walls of the contact hole 46 and moreover the performance of the low dielectric-constant film is not deteriorated as compared with a case of an ashing process, and at the same time the contact hole 46 and the wiring groove 54 where the diameter of the contact hole and the width of the wiring groove are not substantially increased can be formed.

An Exemplified Practical Embodiment 9 of a Manufacturing Method of a Semiconductor Device This exemplified practical embodiment is still another example of a practical embodiment of a manufacturing method of a semiconductor device with reference to the fifth invented method, and it has the same constitution as the manufacturing method of the semiconductor device according to the exemplified practical embodiment 3 except that a separation-material composition for a photo-resist of the exemplified practical embodiment 6 is used instead of the separation-material composition for the photo-resist of the exemplified practical embodiment 3. Therefore, the method of this exemplified practical embodiment will be explained by quoting the drawings of FIG. 8 which relate to the exemplified practical embodiment 3.

This exemplified practical embodiment is an example of forming a wiring structure of a single layer on the base substrate and first, as shown in FIG. 8A, a first wiring 74 which is constituted by a Ti film 74a of a film thickness 20 nm, a TiN film 74b of a film thickness 20 nm, an Al-0.5% Cu film 74c of a film thickness 500 nm, a Ti film 74d of a film thickness 5 nm and a TiN film 74e of a film thickness 100 nm is formed by a magnetron sputtering method on the base substrate 72 on which devices such as transistors (not shown) are preliminarily formed under a film-making condition, for example, as shown below.

(Film-Making Condition of TI Film)
  PRESSURE: 0.52 Pam
  RF OUTPUT: 2 kW
  GAS FLOW RATE: Ar/35 sccm
  GROUTH TEMPERATURE: 300° C.

(Film-Making Condition of TiN Film)
  PRESSURE: 0.78 Pa
  RF OUTPUT: 6 kW
  GAS FLOW RATE: N$_2$/Ar=42/21 sccm
  GROUTH TEMPERATURE: 300° C.

(Film-Making Condition of Al-0.5% Cu Film)
  PRESSURE: 0.52 Pa
  RF OUTPUT: 15 kW
  GAS FLOW RATE: Ar/65 sccm
  GROUTH TEMPERATURE: 300° C.

Next, a photo-resist mask 76 having a wiring pattern is formed on the TiN film 74e by a photolithography technique as shown in FIG. 8B in order to work the first wiring 74 using a dry-etching method.

Subsequently, the first wiring 74 is etching worked under the following etching condition using a dry-etching method as shown in FIG. 8C:

(Dry-Etching Condition)
  GAS FLOW RATE: BCl$_3$/Cl$_2$=100/150 sccm
  PRESSURE: 1 Pa
  MICROWAVE: 400 mA
  RF OUTPUT: 110 W
  OVER-ETCHING: JUST+40% OVER-ETCHING Owing to the etching process, as shown in FIG. 8C, residuals of the photo-resist mask 76 are produced on the first wiring 74 and by-product polymer is produced at the side walls of the first wiring 74, so that these are removed by an ashing process.

Subsequently, according to this exemplified practical embodiment and the photo-resist residuals remaining a little bit on the first wiring 74 and the polymer residuals adhered to the first wiring 74 are removed by the medicinal liquid washing process of 300 seconds using the separation-material composition for the photo-resist of the exemplified practical embodiment 6.

(Condition of Photo-Resist Ashing Process)
  DEVICE: PARALLEL PLANE TYPE RIE DEVICE
  GAS FLOW RATE: O$_2$/3250 sccm
  TEMPERATURE: 250° C.
  PRESSURE: 150 Pa
  OUTPUT: 900 W
  TIME: 60 seconds The separation-material composition for the photo-resist used for the medicinal liquid washing process is a separation-material composition for a photo-resist according to the exemplified practical embodiment 6 which is composed of 1-hydroxyethylidene-1, 9.0 weight % of 1-diphosphonic acid, 42.5 weight % of H$_2$O and 48.5 weight % of diethylene glycol mono-n-buthl ether.

By performing the medicinal liquid washing process using the separation-material composition for the photo-resist according to the exemplified practical embodiment 6, as shown in FIG. 8D, the photo-resist residuals on the first wiring 74 and the polymer residuals on the side walls of the first wiring 74 can be removed nearly completely.

In this way, the first wiring 74 of a single layer wiring structure can be formed on the substrate 72. It should be noted that the wiring structure applied with the fifth invented method is not limited by the example of this exemplified practical embodiment.

An Exemplified Practical Embodiment 10 of a Manufacturing Method of a Semiconductor Device This exemplified practical embodiment is still another example of a practical embodiment of a manufacturing method of a semiconductor device with reference to the fifth invented method, and it has the same constitution as the manufacturing method of the semiconductor device according to the exemplified practical embodiment 4 except that a separation-material composition for a photo-resist of the exemplified practical embodiment 6 is used instead of the separation-material composition for the photo-resist of the exemplified practical embodiment 3. Therefore, the method of this exemplified practical embodiment will be explained by quoting the drawings of FIG. 9 and FIG. 10.

In this exemplified practical embodiment, first, an $SiO_2$ film of 1400 nm thickness is film-made as an interlayer insulation film 78 on the substrate 72 on which the first wiring 74 of a single layer structure is formed in a film-making condition as follows:

(Film-Making Condition of Interlayer Insulation Film)
film-making method: HDP-$SiO_2$ CVD method
TEMPERATURE: 380° C.
OUTPUT: 3250 W
GAS FLOW RATE: $SiH_4/O_2/Ar$=60/110/200 sccm
PRESSURE: 3 mTorr Subsequently, the interlayer insulation film 78 is polished to a 500 nm thickness and the surface thereof is made flat by a CMP method, and a photo-resist mask 80 having a hole pattern of a contact hole is formed by a photolithography technique on the interlayer insulation film 78 as shown in FIG. 9F.

Next, the interlayer insulation film 78 is etching processed from the upper side of the photo-resist mask 80 by using a dry-etching method in an etching condition below, so that a contact hole 82 is opened.

(Dry-Etching Condition)
GAS FLOW RATE: $C_4F_8/Ar/CO/O_2$=20/400/50/13 sccm
PRESSURE: 35 mTorr
RF OUTPUT: 2200 W
OVER-ETCHING: JUST+15% OVER-ETCHING Subsequently, the residuals of the photo-resist mask 78 are removed by an ashing process and further the polymer adhered to the side walls of the contact hole 82 is washed and removed by the medicinal liquid washing process of 300 seconds using the separation-material composition for the photo-resist of the exemplified practical embodiment 6, and further, a pure water rinsing process and a drying process are performed.

(Ashing Condition)
DEVICE: PARALLEL PLANE TYPE RIE DEVICE
GAS FLOW RATE: $O_2$/3250 sccm
TEMPERATURE: 250° C.
PRESSURE: 150 Pa
OUTPUT: 900 W
TIME: 60 seconds The separation-material composition for the photo-resist used for the medicinal liquid washing process is a separation-material composition for a photo-resist according to the exemplified practical embodiment 6 which is composed of 1-hydroxyethylidene-1, 12.0 weight % of 1-diphosphonic acid, 0.17 weight % of ammonium 1-hydrogen difluoride, 42.5 weight % of $H_2O$ and 48.5 weight % of diethylene glycol mono-n-buthl ether.

By performing the medicinal liquid washing process the photo-resist residuals and the polymer can be separated and removed nearly completely.

Next, a TiN film of a 30 nm thickness is film-made by, for example, a directional sputtering method and further, a W (tungsten) film of a 300 nm thickness is film-made to bury the contact hole 82, and subsequently, the W film is polished by a CMP process to form a W-plug 84 burying the contact hole 82 as shown in FIG. 10H.

(Film-Making Condition of W Film) <Corresponding to 20 nm Thermal Oxide Film of Reverse-Sputtering>
TEMPERATURE: 400° C.
PRESSURE: 10.7 kPa
GAS FLOW RATE: $WF_6/H_2/Ar$=40/400/2250 sccm Further, similarly as the exemplified practical embodiment 9, a second wiring 86 connecting to the W-plug 84 is formed on the interlayer insulation film 78 such that a wiring structure of a 2-layer structure having the first wiring 74 and the second wiring 86 which is electrically connected to the first wiring 74 by means of the W-plug 84 can be formed as shown in FIG. 10I.

It should be noted that in this exemplified practical embodiment the interlayer insulation film 78 is not limited by the HDP-$SiO_2$ film. For example, the interlayer insulation film 78 can be made as a stacking structure of a low dielectric-constant insulation film and a silicon oxide film. As an example of the low dielectric-constant insulation film, a silicon oxide film added with fluorine, a silicon oxide film added with carbon and a film which is film-made by a material of hydrogen silsequioxane, methylsilsequioxane, polyacryl ether and Teflon (registered trademark) family can be used.

An Exemplified Practical Embodiment 11 of a Manufacturing Method of a Semiconductor Device This exemplified practical embodiment is an example of a practical embodiment of a manufacturing method of a semiconductor device with reference to the sixth invented method, and it has the same constitution as the manufacturing method of the semiconductor device according to the exemplified practical embodiment 5 except that a separation-material composition for a photo-resist of the exemplified practical embodiment 4 is used instead of the separation-material composition for the photo-resist of the exemplified practical embodiment 1. Therefore, the method of this exemplified practical embodiment will be explained by quoting the drawings of FIG. 13 and FIG. 14.

According to this exemplified practical embodiment, a Cu-buried wiring is formed by a single damascene process on a semiconductor substrate on which a semiconductor device such as a transistor (not shown) is formed in advance.

First, as shown in FIG. 13A, an etching-stopper layer 16 is film-made by piling silicon nitride (SiN) using a reduced pressure CVD method and the like on an insulation film 14 which is film-made on a semiconductor substrate 12, and a low dielectric-constant (low-k) insulation film 18 and a cap insulation film 20 are successively piled on the etching-stopper layer 16 by means of a CVD method and the like.

Subsequently, in this exemplified practical embodiment, a silicon nitride film (SiN film) 21 forming a hard mask is piled by the same CVD method.

Next, a photo-resist mask 22 having a desired wiring groove pattern is formed.

Next, as shown in FIG. 13B, a hard mask 23 which is transferred with a wiring groove pattern of a photo-resist mask 22 is patterning processed by etching the SiN film 21 from the upper side of the photo-resist mask 22. Subsequently, the photo-resist mask 22 is removed by an ashing process and the hard mask 23 is formed on the cap insulation film 20.

Subsequently, as shown in FIG. 13C, the cap insulation film 20 and the low dielectric-constant insulation film 18 are etching processed from the upper side of the hard mask 23, and this etching process is stopped at the surface of the etching-stopper layer 16 such that the wiring groove 24 is formed.

When this etching process is performed, polymer residuals are produced on the bottom wall and the side walls of the wiring groove 24 as shown in FIG. 13C.

Consequently, according to this exemplified practical embodiment, a medicinal liquid washing process which uses the separation-material composition for the photo-resist of the exemplified practical embodiment 4 is performed for 300 seconds at the insulation film stacking structure formed by the wiring groove pattern 24 so as to remove the polymer residuals, and subsequently a pure water rinsing process and a successive drying process are performed according to an ordinary method.

The separation-material composition for the photo-resist used for the medicinal liquid washing process is a separation-material composition for a photo-resist according to the exemplified practical embodiment 4 which is composed of 1-hydroxyethylidene-1, 3.0 weight % of 1-diphosphonic acid, 0.12 weight % of ammonium fluoride, 48.38 weight % of $H_2O$ and 48.5 weight % of diethylene glycol mono-n-buthl ether.

In this exemplified practical embodiment, the medicinal liquid washing process is performed by using the separation-material composition for the photo-resist according to the exemplified practical embodiment 4, so that the polymer residuals are nearly completely removed from the wiring groove 24 as shown in FIG. 14D.

In this case it should be noted that it can be avoided from a phenomenon that the performance of the low dielectric-constant film is deteriorated and the width of the wiring groove is widened which will happen when a conventional separation-material composition for the photo-resist is used.

Next, as shown in FIG. 14E, a metal film 26 such as TaN and a Cu plated thin film 28 are film-made on the whole surface of the substrate by, for example, a sputtering method for the purpose of a wiring metal diffusion prohibition, and a conductive wiring layer 30 such as copper (Cu) is subsequently piled in the wiring groove 24 by, for example, a plating method so as to bury the wiring groove 24.

Next, as shown in FIG. 14F, the wiring layer 30, the metal film 26, the Cu thin film 28 and the SiN film 21 composing the hard mask 23 which were piled outside of the wiring groove 24 are removed by a CMP method and the like so as to form a Cu wiring 32.

After performing the above processes, it becomes possible to form the Cu-buried wiring 32 of a single layer buried in the low dielectric-constant insulation film 18 and the cap insulation film 20 which are film-made on the insulation film 14 and the etching-stopper layer 16 on the semiconductor substrate 12.

The Cu-buried wiring 32 formed in this exemplified practical embodiment is performed with the medicinal liquid washing process of the exemplified practical embodiment 1, so that it is different from the Cu-buried wiring formed by a conventional single damascene method as shown in FIG. 12A such that the low dielectric-constant insulation film does not retreat and the polymer residuals are nearly completely removed.

In this way, the TaN film 26 and the Cu plated thin film 28 are film-made with an excellent coverage and there happens no problem such as a problem of the copper diffusing to the insulation film and a problem of a void production.

In this exemplified practical embodiment, the method of the present invention is explained taking an example of forming a wiring groove, but this exemplified practical embodiment can be applied when a contact hole is formed at an interlayer insulation film where a similar effect can be obtained.

An Exemplified Practical Embodiment 12 of a Manufacturing Method of a Semiconductor Device This exemplified practical embodiment is another example of a practical embodiment of a manufacturing method of a semiconductor device with reference to the sixth invented method, and it is carried out similarly as the manufacturing method of the semiconductor device according to the exemplified practical embodiment 6 except that a separation-material composition for a photo-resist of the exemplified practical embodiment 4 is used instead of the separation-material composition for the photo-resist of the exemplified practical embodiment 1. Therefore, the method of this exemplified practical embodiment will be explained by quoting the drawings of FIG. 15 to FIG. 19.

According to this exemplified practical embodiment, an upper layer wiring of a dual damascene structure is formed so as to be connected to the Cu-buried wiring 32 manufactured in the exemplified practical embodiment 11 as same as the case of the exemplified practical embodiment 6.

First, as shown in FIG. 15A, an etching-stopper layer 34, a low dielectric-constant insulation film 36, an etching-stopper layer 38, a low dielectric-constant insulation film 40 and a cap insulation film 42 are successively stacked on a Cu buried wiring 32 by means of a CVD method and the like.

Next, in this exemplified practical embodiment, a first mask $SiO_2$ film 43 forming a first hard mask, a second mask $SiO_2$ film 45 forming a second hard mask and a reflection prohibition film 44 are successively film-made on the cap insulation film 42.

Subsequently, a photo-resist mask 47 having a predetermined wiring groove pattern is film-made on the reflection prohibition film 44.

Next, as shown in FIG. 15B, a second hard mask 49 which is transferred with a wiring groove pattern of a photo-resist mask 47 is patterning processed by etching the reflection prohibition film 44 and the second mask $SiO_2$ film 45 from the upper side of the photo-resist mask 47. Subsequently, the photo-resist mask 47 is removed by an ashing process and the second hard mask 49 is formed on the first mask $SiO_2$ film 43.

Subsequently, as shown in FIG. 16C, a photo-resist mask 51 having a contact hole pattern is formed on the first mask $SiO_2$ film 43 and the second mask 49.

Next, a first mask 53 which is transferred with a contact hole pattern of a photo-resist mask 51 is patterning processed by etching the first mask $SiO_2$ film 43 from the upper side of the photo-resist mask 51 as shown in FIG. 16D. Subsequently, the photo-resist mask 51 is removed by an ashing process and the first hard mask 53 having a contact hole pattern is formed on the cap insulation film 42.

Subsequently, the cap insulation film 42 and the low dielectric-constant insulation film 40 are etching processed from the upper side of first hard mask 53 to which the contact hole pattern is transferred and this etching process is stopped at the surface of the etching-stopper layer 38 such that an aperture portion 55 having the contact hole pattern is formed as shown in FIG. 17E. When this etching process is performed, polymer residuals are produced on the bottom wall and the side walls of the aperture portion 55 as shown in FIG. 17E.

Subsequently, the first hard mask 53, the cap insulation film 42 and the low dielectric-constant insulation film 40 are etching processed from the upper side of the second hard mask 49 to which the wiring groove pattern is transferred and this etching process is stopped at the surface of the etching-stopper layer 38 such that the wiring groove 54 is formed as shown in FIG. 17F.

At the same time, the etching-stopper layer 38 at the bottom of the aperture portion 55 and the low dielectric-constant insulation film 36 are etching processed so as to open the contact hole 46 and this etching process is stopped at the surface of the etching-stopper layer 34.

Next, the etching-stopper layer 34 is etching processed and the contact hole 46 is made connected to the Cu-buried wiring 32 of the lower layer each other as shown in FIG. 18G. In this stage, polymer residuals are adhered to the bottom wall and the side walls of the wiring groove 54 and to the bottom wall and the side walls of the contact hole 46.

Consequently, in a stage that the wiring groove 54 and the contact hole 46 are formed according to this exemplified practical embodiment, a medicinal liquid washing process which uses the separation-material composition for the photo-resist of the exemplified practical embodiment 4 is performed for 60 seconds so as to remove polymer residuals, and subsequently a pure water rinsing process and a successive drying process are performed according to an ordinary method.

The separation-material composition for the photo-resist used for the medicinal liquid washing process is a separation-material composition for a photo-resist according to the exemplified practical embodiment 4 which is composed of 1-hydroxyethylidene-1, 3.0 weight % of 1-diphosphonic acid, 0.12 weight % of anmonium fluoride, 48.38 weight % of $H_2O$ and 48.5 weight % of diethylene glycol mono-n-buthl ether.

In this exemplified practical embodiment, the medicinal liquid washing process is performed by using the separation-material composition for the photo-resist according to the exemplified practical embodiment 4, so that the polymer residuals are nearly completely removed from the bottom wall and the side walls of the wiring groove 54 and from the bottom wall and the side walls of the contact hole 46 as shown in FIG. 18H.

In this case it should be noted that it can be avoided from a phenomenon that the performance of the low dielectric-constant film is deteriorated and the width of the wiring groove or the diameter of the contact hole is widened which will happen when a conventional separation-material composition for the photo-resist is used as shown in FIGS. 1A and 1B.

Next, as shown in FIG. 19I, a metal film 56 such as TaN and a Cu plated thin film 58 are film-made on the whole surface of the substrate by, for example, a sputtering method for the purpose of a wiring metal diffusion prohibition, and a conductive wiring layer 60 such as copper (Cu) is subsequently piled in the wiring groove 54 by, for example, a plating method so as to bury the wiring groove 54.

Next, as shown in FIG. 19J, the wiring layer 60, the metal film 56/the Cu thin film 58 and the hard mask 53 which were piled outside of the wiring groove 54 are removed by a CMP method and the like so as to form a Cu-buried wiring 62.

After performing the above processes, it becomes possible to form an upper layer wiring structure of a dual damascene structure connected to the Cu-buried wiring 32, that is, a Cu plug burying the connecting aperture 46 which is connected to the Cu-buried wiring 32 each other by passing through the etching-stopper layer 34, the low dielectric-constant insulation film 36 and the etching-stopper layer 38 and the Cu-buried wiring 62 burying the wiring groove 54 can be formed at the same time.

The Cu-buried wiring 62 of a dual damascene structure formed in this exemplified practical embodiment is performed with the medicinal liquid washing process of the exemplified practical embodiment 4, so that it is different from the Cu-buried wiring formed by a conventional dual damascene method as shown in FIG. 12B, FIG. 1A and FIG. 1B such that the low dielectric-constant insulation film does not retreat and the photo-resist residuals and the polymer residuals are nearly completely removed.

In this way, the TaN film 56 and the Cu plated thin film 58 are film-made with an excellent coverage and there happens no problem such as a problem of the copper diffusing to the insulation film and a problem of a void production.

Further, the evaluation of the separation-material composition for the photo-resist described with reference to the separation-material composition for the photo-resist according to the exemplified practical embodiment 4 and shown in the table 2 is also true for the manufacturing method of a semiconductor device according to the exemplified practical embodiments 11 and 12. In more detail, by using the separation-material composition for the photo-resist according to the exemplified practical embodiment 4, it becomes possible to remove the photo-resist residuals and polymer residuals and at the same time to suppress the quality change and the retreat amount of the low dielectric-constant insulation film.

It is possible to form a multi-layer wiring structure having a desired number of layers by applying a method of the exemplified practical embodiment 12 in order to form more upper layer metal wirings until a desired number of layers on the Cu-buried wiring 62.

Further, in the exemplified practical embodiment 12, the polymer residuals are removed by a medicinal liquid process in the stage of FIG. 17F where the wiring groove 54 and the contact hole 46 are formed, but it is possible to remove the polymer residuals by a medicinal liquid process in the stage of FIG. 17E where the aperture portion 55 is opened or in the stage of FIG. 17F where the contact hole 46 and the wiring groove 54 are approximately formed.

As it is clear in the above explanation, according to the first invention, a separation-material composition for a photo-resist can be realized by using at least sulfamic acid and water as a component of the separation-material composition for the photo-resist when a photo-resist mask is removed by the separation-material composition for the photo-resist where the oxidization and the erosion of the low dielectric-constant insulation film are suppressed and the photo-resist mask residuals and the by-product polymer can be nearly completely removed while an excellent performance of the low dielectric-constant insulation film is maintained.

According to the second invention, a separation-material composition for a photo-resist can be realized by using at least phosphonic acid and a water-soluble organic solvent as a component of the separation-material composition for the photo-resist when a photo-resist mask is removed by the separation-material composition for the photo-resist where the erosion of the Cu wiring and the insulation film are prohibited, and especially, the oxidization and the erosion of the low dielectric-constant insulation film are suppressed and the photo-resist mask residuals and the by-product polymer can be nearly completely removed while an excellent performance of the low dielectric-constant insulation film is maintained.

According to the first to the third invented methods, the medicinal liquid washing process is performed at the photo-resist mask used for the process of the under-layer by using a separation-material composition for a photo-resist according to the first invention, so that the oxidization and the erosion of the low dielectric-constant insulation film are suppressed and the photo-resist mask residuals and the by-product polymer can be nearly completely removed while an excellent performance of the low dielectric-constant insulation film is maintained.

According to the fourth to the sixth invented methods, the medicinal liquid washing process is performed at the photo-resist mask used for the process of the under-layer by using a separation-material composition for a photo-resist according to the second invention, so that the oxidization and the erosion of the low dielectric-constant insulation film are suppressed and the photo-resist mask residuals and the by-product polymer can be nearly completely removed while an excellent performance of the low dielectric-constant insulation film is maintained.

By applying the first to sixth invented methods, it becomes possible to realize a manufacture of a semiconductor device having a desired characteristic without causing a decrease in the yield or the reliability.

Additionally, according to the first to sixth invented methods, the photo-resist residuals or polymer residuals can be surely separated and removed, so that the characteristic deterioration of a semiconductor device when manufacturing the semiconductor device can be surely avoided.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A separation-material composition for a photo-resist which is used when a photo-resist mask having a photo-resist pattern is formed on an under-layer, said under-layer is subsequently processed by using said photo-resist mask and said photo-resist mask is removed thereafter, wherein the separation-material composition contains sulfamic acid, ammonium fluoride or ammonium 1-hydrogen difluoride, water, and water-soluble organic solvent, which includes one or more compounds selected from the group consisting of the polyhydric alcohol family and polyhydric alcohol family derivatives, wherein the polyhydric alcohol family and the polyhydric alcohol family derivatives are glycol compounds, wherein the content of sulfamic acid is in a range from 1.0 weight % to 5.0 weight %, the content of ammonium fluoride or ammonium 1-hydrogen difluoride is in a range from 0.01 weight % to 1.0 weight %, the content of water-soluble organic solvent is in a range from 30 weight % to 95 weight %, and water is included for the remainder, and wherein the pH of the separation-material composition is equal to or less than 4.

2. The separation-material composition for a photo-resist according to claim 1, wherein the polyhydric alcohol family and polyhydric alcohol family derivatives are selected from the group consisting of ethylene glycol, ethylene glycol monomethyl ether, ethylene glycol monoethyl ether, ethylene glycol monopropyl ether, ethylene glycol monobuthyl ether, ethylene glycol monomethyl ether acetate, ethylene glycol monoethyl ether acetate, ethylene glycol monopropyl ether acetate, ethylene glycol monobuthyl ether acetate, diethylene glycol, diethylene glycol monomethyl ether, diethylene glycol monoethyl ether, diethylene glycol monopropyl ether, diethylene glycol monobuthyl ether, diethylene glycol monomethyl ether acetate, diethylene glycol monoethyl ether acetate, diethylene glycol monopropyl ether acetate, diethylene glycol monobuthyl ether acetate, triethylene glycol monomethyl ether, propylene glycol, propylene glycol monomethyl ether, propylene glycol monoethyl ether, propylene glycol monopropyl ether, propylene c monobuthyl ether, dipropylene glycol monomethyl ether, dipropylene glycol monoethyl ether, dipropylene glycol monopropyl ether, dipropylene glycol monobuthyl ether, dipropylene glycol monomethyl ether acetate, dipropylene glycol monoethyl ether acetate, dipropylene glycol monopropyl ether acetate, diethylene glycol monobuthyl ether acetate, diethylene glycol dimethyl ether, diethylene glycol diethyl ether, diethylene glycol dipropyl ether, diethylene glycol dibuthyl ether, dipropylene glycol dimethyl ether, dipropylene glycol diethyl ether, dipropylene glycol dipropyl ether, and dipropylene glycol dibuthyl ether.

* * * * *